United States Patent
Ikemoto

(10) Patent No.: US 9,568,606 B2
(45) Date of Patent: Feb. 14, 2017

(54) IMAGING APPARATUS FOR DISTANCE DETECTION USING HIGH AND LOW SENSITIVITY SENSORS WITH INVERTED POSITIONAL RELATIONS

(71) Applicant: CANON KABUSHIKI KAISHA, Tokyo (JP)

(72) Inventor: Kiyokatsu Ikemoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 178 days.

(21) Appl. No.: 13/798,830

(22) Filed: Mar. 13, 2013

(65) Prior Publication Data
US 2013/0258098 A1  Oct. 3, 2013

(30) Foreign Application Priority Data

Mar. 29, 2012  (JP) .................................. 2012-075646

(51) Int. Cl.
| | | |
|---|---|---|
| *G01S 17/89* | (2006.01) | |
| *G01S 11/12* | (2006.01) | |
| *H04N 5/355* | (2011.01) | |
| *H01L 27/146* | (2006.01) | |

(52) U.S. Cl.
CPC ................ *G01S 17/89* (2013.01); *G01S 11/12* (2013.01); *H01L 27/14621* (2013.01); *H01L 27/14627* (2013.01); *H04N 5/35563* (2013.01)

(58) Field of Classification Search
CPC ...... G01S 17/89; G01S 11/12; H04N 5/35563; H01L 27/14621; H01L 27/14627
See application file for complete search history.

(56) References Cited

U.S. PATENT DOCUMENTS

| 7,468,746 B2 | 12/2008 | Sugimoto | |
|---|---|---|---|
| 8,213,022 B1 * | 7/2012 | Riza ..................... | G01B 11/026 356/495 |
| 8,817,162 B2 | 8/2014 | Takagi | |
| 2001/0012016 A1 * | 8/2001 | Ide ........................ | G01S 7/4811 345/582 |

(Continued)

FOREIGN PATENT DOCUMENTS

| JP | 2003-244712 A | 8/2003 |
|---|---|---|
| JP | 2004-222184 A | 8/2004 |

(Continued)

*Primary Examiner* — Richard Torrente
*Assistant Examiner* — Joseph Suh
(74) *Attorney, Agent, or Firm* — Fitzpatrick, Cella, Harper & Scinto

(57) ABSTRACT

An imaging apparatus includes an imaging optical system having an exit pupil and an image sensor having pixels including first and second pixels. Each pixel has high and low sensitivity light receiving sections and a pupil divider. Each of the first pixels is arranged near one of the second pixels. The pupil divider guides light from a part of the exit pupil of the imaging optical system to the high or low sensitivity light receiving section in a first pixel and guides light from another part of the exit pupil to the high or low sensitivity light receiving section in the neighboring second pixel. The positional relation between the high and low sensitivity light receiving sections relative to the center in a pixel is mutually inverted in the pupil dividing direction between a first pixel and the neighboring second pixel.

19 Claims, 12 Drawing Sheets

(56) References Cited

U.S. PATENT DOCUMENTS

| | | | | |
|---|---|---|---|---|
| 2003/0020814 | A1* | 1/2003 | Ono | H04N 5/225 348/220.1 |
| 2004/0012711 | A1* | 1/2004 | Tamaru | H04N 5/2351 348/362 |
| 2004/0145664 | A1* | 7/2004 | Kobayashi | H04N 5/367 348/246 |
| 2004/0145672 | A1* | 7/2004 | Sugimoto | H04N 5/2355 348/363 |
| 2006/0119726 | A1* | 6/2006 | Oda | H04N 5/235 348/315 |
| 2006/0131483 | A1* | 6/2006 | Schrey | G01S 7/4816 250/214 R |
| 2007/0215912 | A1* | 9/2007 | Kido | H01L 27/14603 257/257 |
| 2007/0223059 | A1* | 9/2007 | Oishi | H04N 1/0402 358/482 |
| 2008/0179490 | A1* | 7/2008 | Ohno | G01J 1/4228 250/201.1 |
| 2008/0297609 | A1* | 12/2008 | Song | H04N 3/155 348/207.99 |
| 2008/0303919 | A1* | 12/2008 | Egawa | G06T 1/0007 348/223.1 |
| 2008/0315074 | A1* | 12/2008 | Konno | G02B 3/0006 250/214 R |
| 2011/0249161 | A1 | 10/2011 | Takagi | |
| 2011/0279414 | A1* | 11/2011 | Noma | G02F 1/1336 345/175 |
| 2011/0304753 | A1* | 12/2011 | Shintani | H01L 27/14621 348/279 |
| 2012/0200751 | A1* | 8/2012 | Kato | H01L 27/14627 348/294 |

FOREIGN PATENT DOCUMENTS

| | | |
|---|---|---|
| JP | 2007-158692 A | 6/2007 |
| JP | 2007-184840 A | 7/2007 |
| JP | 4027113 B2 | 12/2007 |
| JP | 2009-192882 A | 8/2009 |
| JP | 2011-222827 A | 11/2011 |
| JP | 2011-257565 A | 12/2011 |
| JP | 2012-037777 A | 2/2012 |
| JP | 2012-049994 A | 3/2012 |

* cited by examiner

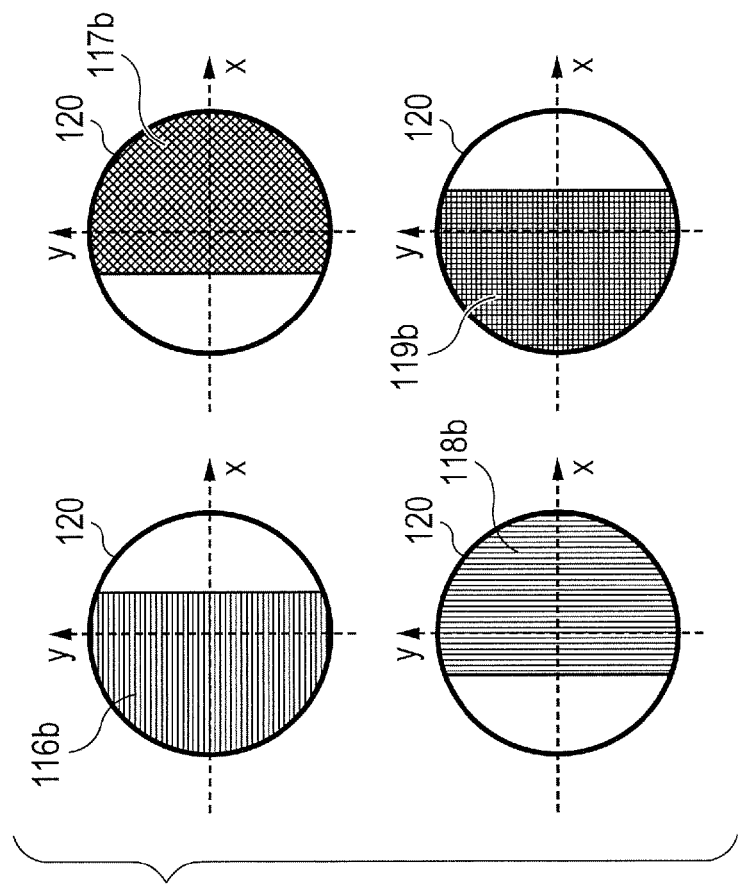
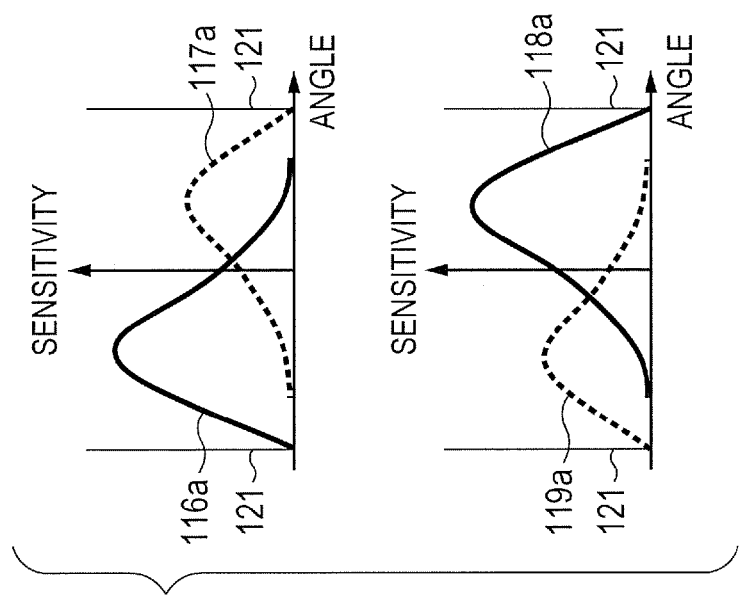

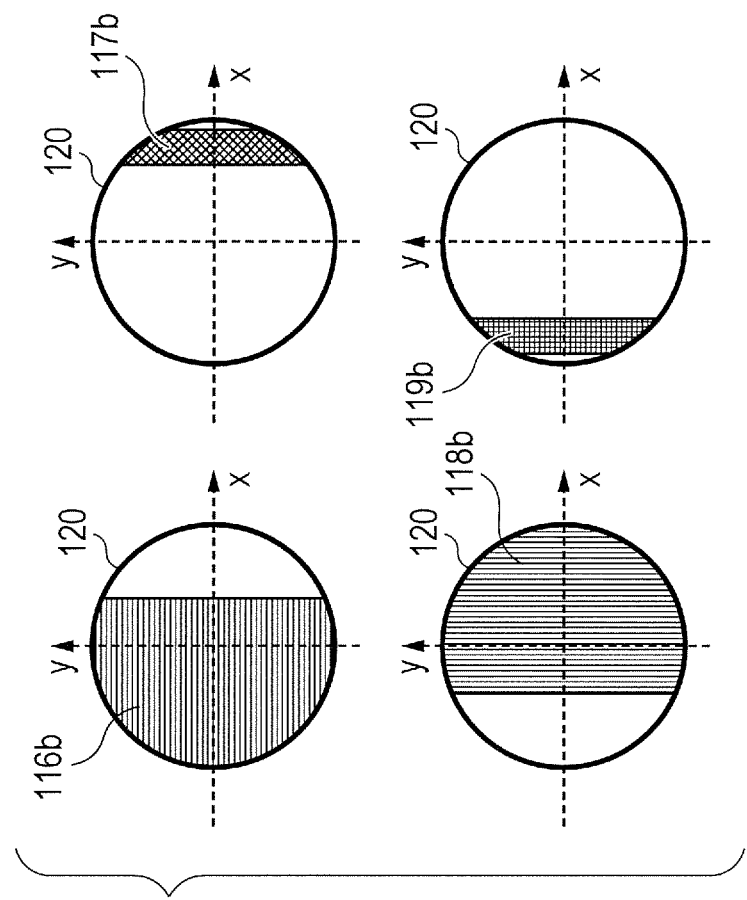
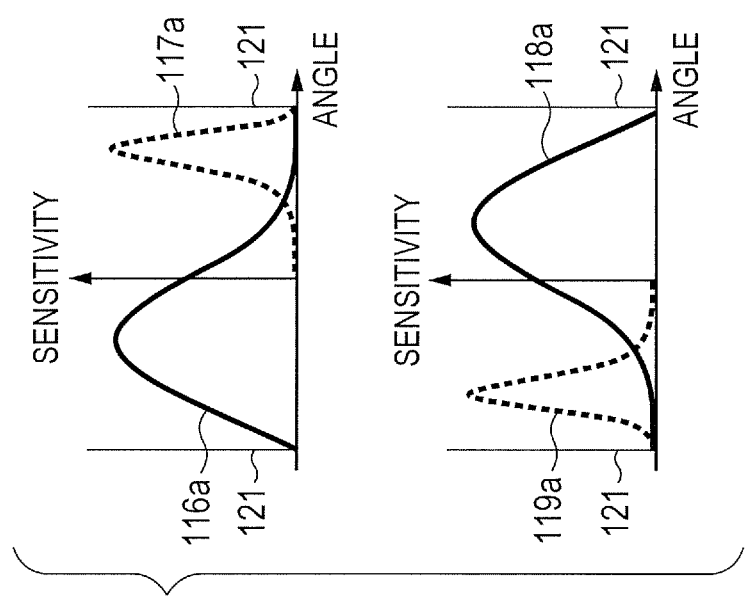

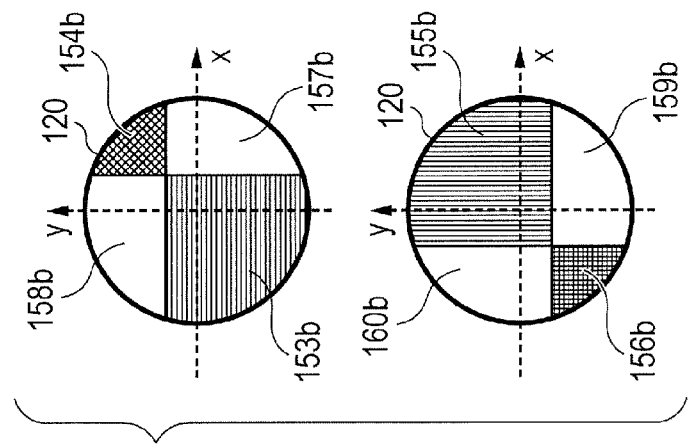
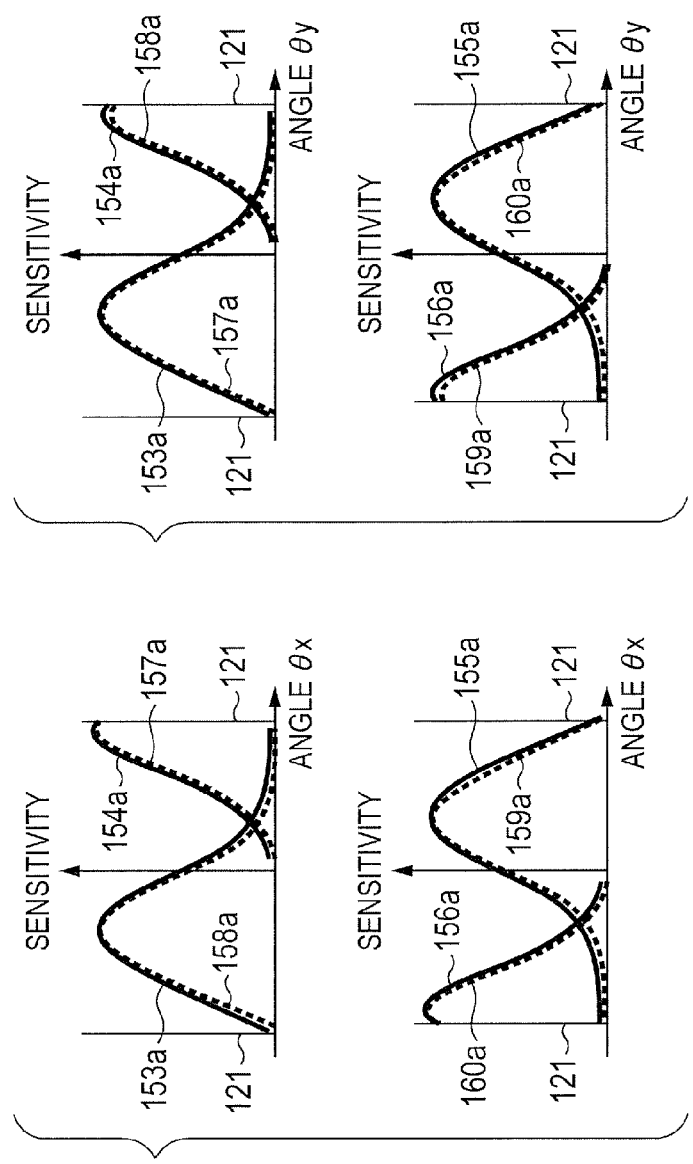

IMAGING APPARATUS FOR DISTANCE DETECTION USING HIGH AND LOW SENSITIVITY SENSORS WITH INVERTED POSITIONAL RELATIONS

BACKGROUND OF THE INVENTION

Field of the Invention

The present invention relates to an imaging apparatus and a camera system. More particularly, the present invention relates to an imaging apparatus that can be used for camera systems such as digital still cameras and digital video cameras.

Description of the Related Art

Japanese Patent No. 4,027,113 Publication (to be referred to as "Patent Literature 1" hereinafter) proposes a solid state image sensor (imaging apparatus) that can be used for digital still cameras and digital video cameras and in which ranging pixels having a ranging feature are arranged as part or all of the pixels of the image sensor for detection by means of a phase difference method.

Each ranging pixel has a plurality of photoelectric conversion sections and is so configured that luminous fluxes that pass through different pupil areas of the camera lens are guided to different photoelectric conversion sections.

Then, optical images (to be referred to as ranging images hereinafter) formed by luminous fluxes that have passed through different pupil areas are acquired by means of the signals obtained by the photoelectric conversion sections contained in each ranging pixel.

The distance to an object can be measured by computing the amounts of defocuses by means of triangulation using stereo images on the basis of the amounts of discrepancies of the ranging images.

Thus, any distance can be measured highly accurately at a high speed by means of this arrangement because, unlike the conventional contrast method, the camera lens does not need to be moved to measure the distance.

Additionally, the signals obtained by the plurality of photoelectric conversion sections contained in each ranging pixel can be used for the pixel value of the ranging pixel for producing a picked-up image.

When an image of a low luminance object is picked up by means of an imaging apparatus having such ranging pixels, only a small quantity of light enters each photoelectric conversion section of a ranging pixel. Then, as a result, the intensity of the acquired signals becomes low so as to degrade the S/N ratio and the quality of the signals.

When, on the other hand, an image of a high luminance object is picked up, a large quantity of light enters each photoelectric conversion section. When the quantity of light that enters a photoelectric conversion section exceeds a predetermined threshold value, the amount of electric charge that is subjected to photoelectric conversion and accumulated exceeds a tolerance value. Then, the obtained signal is saturated at a maximum value and the signal can no longer be acquired accurately. For this reason, an image sensor having such known ranging pixels cannot acquire high quality signals when detecting the distance to a low luminance or high luminance object and picking up an image thereof.

Then, in a ranging operation of measuring the distance to an object, both the accuracy of ranging images and the ranging accuracy fall.

Additionally, in an operation of producing an image, both the accuracy of the pixel values of ranging pixels and the quality of a picked up image fall.

SUMMARY OF THE INVENTION

In view of the above-identified problems, therefore, an object of the present invention is to provide an imaging apparatus and a camera system that can improve the ranging accuracy to an object regardless of whether it is a low luminance object or a high luminance object and also the quality of the image of the object picked up by the apparatus.

In the first mode of carrying out the present invention, there is provided an imaging apparatus including: an image sensor; and an imaging optical system for forming an image of an object on the image sensor; the image sensor having pixels for generating imaging signals, each being either a first pixel including a first high sensitivity light receiving section, a first low sensitivity light receiving section and a first pupil dividing means or a second pixel including a second high sensitivity light receiving section, a second low sensitivity light receiving section and a second pupil dividing means, the image sensor having both first pixels and second pixels; each of the first pixels being arranged near one of the second pixels; the first high sensitivity light receiving sections, the first low sensitivity light receiving sections, the second high sensitivity light receiving sections and the second low sensitivity light receiving sections having respective photoelectric conversion sections; the positional relation between the first high and low sensitivity light receiving sections and the positional relation between the second high and low sensitivity light receiving sections, relative to the centers of the first pixels and the centers of the second pixels, respectively, being a mutually inverted in a pupil dividing direction; each of the first pupil dividing means being so configured as to be able to guide light from an area of a part of the exit pupil of the imaging optical system to the corresponding first high sensitivity light receiving section, each of the second pupil dividing means being so configured as to be able to guide light from the area of another part of the exit pupil of the imaging optical system to the corresponding second high sensitivity light receiving section; each of the first pupil dividing means being so configured as to be able to guide light from an area of a part of the exit pupil of the imaging optical system to the corresponding first low sensitivity light receiving section, each of the second pupil dividing means being so configured as to be able to guide light from the area of another part of the exit pupil of the imaging optical system to the corresponding second low sensitivity light receiving section; distance detecting signals and imaging signals being generated by the light receiving sections of the first pixels and those of the second pixels.

In the second mode of carrying out the present invention, there is provided an imaging apparatus including: an image sensor; and an imaging optical system for forming an image of an object on the image sensor; the image sensor having first pixels, each including a first high sensitivity light receiving section, a first low sensitivity light receiving section and a first pupil dividing means, and second pixels, each including a second high sensitivity light receiving section, a second low sensitivity light receiving section and a second pupil dividing means; each of the first pixels being arranged near one of the second pixels; the first high sensitivity light receiving sections, the first low sensitivity light receiving sections, the second high sensitivity light receiving sections and the second low sensitivity light receiving sections having respective photoelectric conversion sections; the positional relation between the first high and low sensitivity light receiving sections and the positional relation between the second high and low sensitivity light receiving sections, relative to the centers of the first pixels and the centers of the second pixels, respectively, being a mutually inverted in a pupil dividing direction; each of the first pupil dividing means being so configured as to be able to guide light from an area of a part of the exit pupil of the imaging optical system to the corresponding first high sensitivity light receiving section, each of the second pupil dividing means being so configured as to be able to guide light from the area of another part of the exit pupil of the imaging optical system to the corresponding second high sensitivity light receiving section; each of the first pupil dividing means being so configured as to be able to guide light from an area of a part of the exit pupil of the imaging optical system to the corresponding first low sensitivity light receiving section, each of the second pupil dividing means so configured as to be able to guide light from the area of another part of the exit pupil of the imaging optical system to the corresponding second low sensitivity light receiving section; distance detecting signals being generated by the light receiving sections of the first pixels and those of the second pixels; each of the pupil dividing means having optical waveguides respectively above the first high sensitivity light receiving section and the first low sensitivity light receiving section of the first pixel or above the second high sensitivity light receiving section and the second low sensitivity light receiving section of the second pixel.

Further features of the present invention will become apparent from the following description of exemplary embodiments with reference to the attached drawings.

Thus, according to the present invention, there are provided an imaging apparatus and a camera system that can improve the ranging accuracy to an object regardless of it is a low luminance object or a high luminance object and also the quality of the image of the object picked up by the apparatus.

BRIEF DESCRIPTION OF THE DRAWINGS

FIGS. 3A and 3B are views illustrating characteristics of pixels in the imaging apparatus according to the embodiment of the present invention;

FIGS. 4A and 4B are views illustrating characteristics of pixels in the imaging apparatus according to the embodiment of the present invention;

FIGS. 6A, 6B and 6C are views illustrating characteristics of pixels in the imaging apparatus according to the embodiment of the present invention;

DESCRIPTION OF THE EMBODIMENTS

Now, an imaging apparatus according to an embodiment of the present invention will be described below by referring to FIGS. 1A through 1C and 2.

Figure 1A:
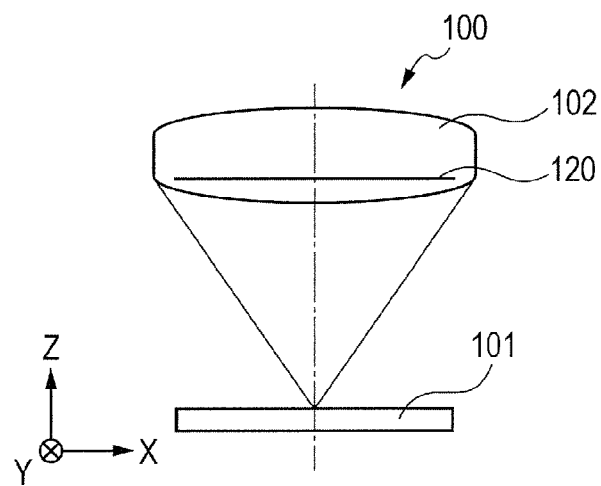
FIGS. 1A, 1B and 1C are views illustrating an imaging apparatus according to an embodiment of the present invention.

Referring firstly to FIG. 1A, imaging apparatus 100 includes an image sensor 101 and an imaging lens 102, or an imaging optical system, for forming an image of an object on the image sensor.

Figure 1B:
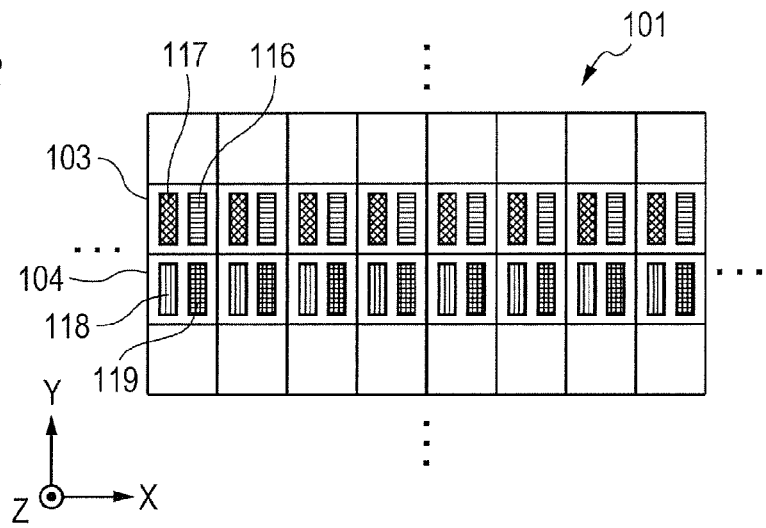
Figure 1C:
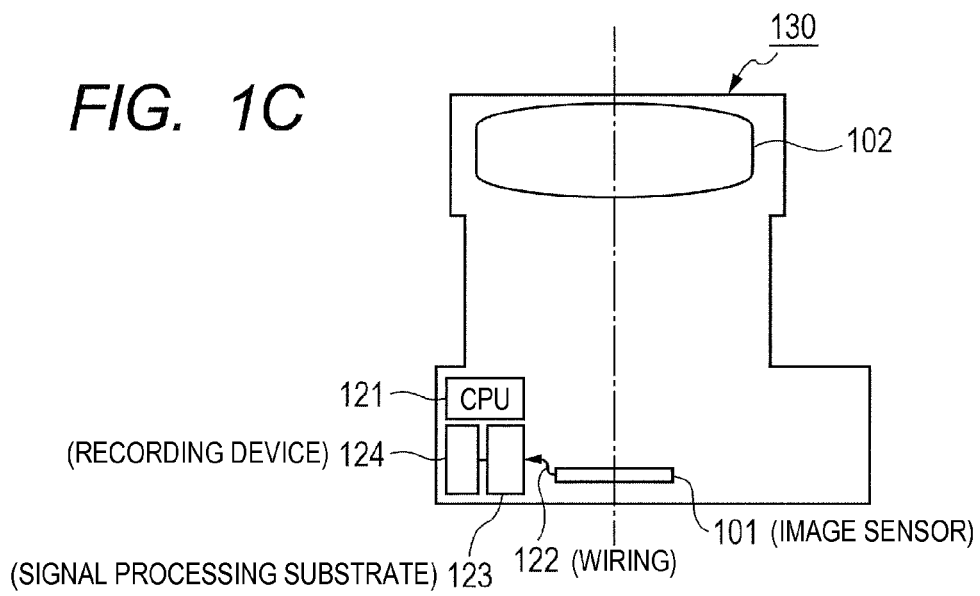

A camera system 130 is formed by combining such an imaging apparatus 100 and other elements as illustrated in FIG. 1C.

The camera system 130 illustrated in FIG. 1C has a CPU 121 for controlling the imaging apparatus 100 and wiring 122, a signal processing substrate 123 and a recording device 124 for reading, processing and recording the signals acquired by the image sensor 101.

The imaging lens 102 forms an image of the object on the image sensor 101. FIG. 1B schematically illustrates a part of the image sensor 101.

The image sensor 101 has pixels 103 and pixels 104 that have a ranging feature and are arranged so as to be mutually close to each other.

Note that a pixel in this embodiment is the smallest means that forms a picked-up image.

Figure 2:
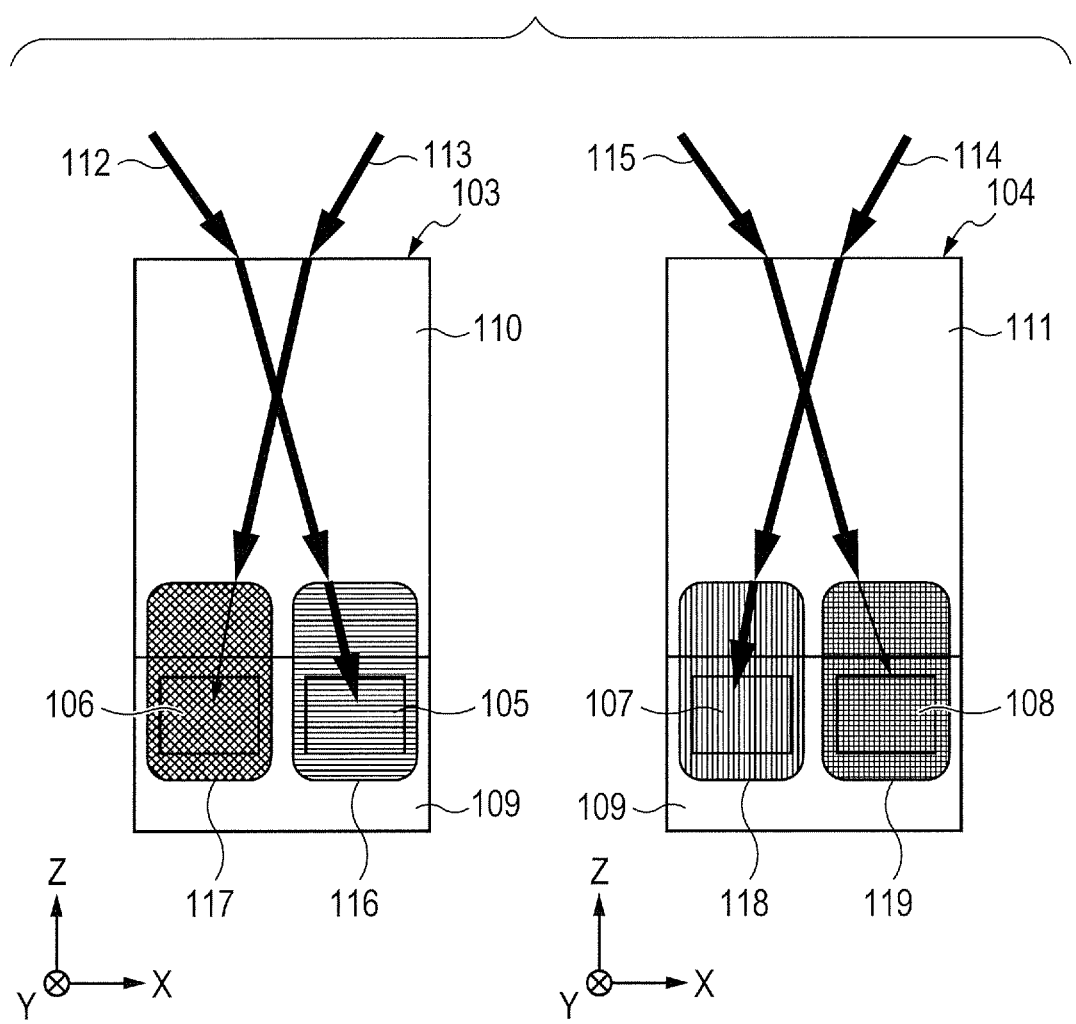
FIG. 2 is a schematic illustration of the configurations of pixels in the imaging apparatus according to the embodiment of the present invention.

FIG. 2 schematically illustrates a pixel 103 and a pixel 104.

The pixel (first pixel) 103 includes a pupil dividing means (first pupil dividing means) 110, a high sensitivity light receiving section (first high sensitivity light receiving section) 116 and a low sensitivity light receiving section (first low sensitivity light receiving section) 117.

The pixel (second pixel) 104, on the other hand, includes a pupil dividing means (second pupil dividing means) 111, a high sensitivity light receiving section (second high sensitivity light receiving section) 118 and a low sensitivity light receiving section (second low sensitivity light receiving section) 119. Additionally, each pixel has a color filter (not illustrated).

The high sensitivity light receiving section 116 and the low sensitivity light receiving section 117 of the pixel 103 and the high sensitivity light receiving section 118 and the low sensitivity light receiving section 119 of the pixel 104 have a mutually inverted positional relationship relative to the center of the first pixel and the center of the second pixel as viewed in the pupil dividing direction (x-direction).

The light receiving sections (the high sensitivity light receiving section 116, the low sensitivity light receiving section 117, the high sensitivity light receiving section 118 and the low sensitivity light receiving section 119) respectively include photoelectric conversion sections 105, 106, 107 and 108 disposed in the substrate 109. The substrate 109 is made of a material that absorbs light in a band of wavelength to be imaged such as Si. The photoelectric conversion sections 105, 106, 107 and 108 are formed respectively at least in the regions of parts of the substrate 109 typically by ion implantation. Luminous fluxes that respectively get to the photoelectric conversion sections are converted into electric signals by the imaging lens 102 and output from a signal processing circuit (not illustrated).

The pupil dividing means 110 is so configured as to guide luminous flux 112 from the area of a part of the exit pupil 120 of the imaging lens 102 to the photoelectric conversion section 105 and also guide luminous flux 113 from the area of another part of the exit pupil 120 to the photoelectric conversion section 106.

The pupil dividing means 111 is so configured as to guide luminous flux 114 from the area of still another part of the exit pupil 120 that is different from the region where the luminous flux 112 passes to the photoelectric conversion section 107.

Furthermore, the pupil dividing means 111 is so configured as to guide luminous flux 115 from the area of still another part of the exit pupil 120 that is different from the region where the luminous flux 113 passes to the photoelectric conversion section 108.

The high sensitivity light receiving section 116 and the low sensitivity light receiving section 117 of the pixel 103 are so configured as to make the quantity of light received by the photoelectric conversion section 105 greater than the quantity of light received by the photoelectric conversion section 106 of the luminous flux that enters the pixel 103 from the imaging lens 102.

The high sensitivity light receiving section 118 and the low sensitivity light receiving section 119 of the pixel 104 are so configured as to make the quantity of light received by the photoelectric conversion section 107 greater than the quantity of light received by the photoelectric conversion section 108 of the luminous flux that enters the pixel 104 from the imaging lens 102.

The ranging images formed by the luminous fluxes that pass through different pupil areas are acquired by the high sensitivity light receiving sections 116 and 118 or the low sensitivity light receiving sections 117 and 119 and hence the distance to the object can be found out by means of a known technique.

A pixel signal can be generated for the picked-up image of the first pixel at least by the signal acquired by either the high sensitivity light receiving section 116 or the low sensitivity light receiving section 117 of all the signals acquired by them.

Differently stated, a pixel value of the picked-up image of the pixel 103 can be generated by using either or both of the signals.

Similarly, a pixel value can be generated for the picked-up image of the pixel 104 by the signals acquired by the high sensitivity light receiving section 118 and the low sensitivity light receiving section 119.

Then, as a result, both information on the distance to the object and image information on the object can be acquired simultaneously.

Exemplary characteristics of the light receiving sections of FIG. 2 are illustrated in FIGS. 3A and 3B. In the graphs of FIG. 3A, the horizontal axes represent the angle of the luminous flux entering a pixel. More specifically, the horizontal axes represent the angle formed between the luminous flux and the z-axis standing up from the xy-plane.

In the graphs of FIG. 3A, the vertical axes represent the sensitivity. In FIG. 3A, solid lines 116a and 118a respectively illustrate the characteristics of the high sensitivity light receiving sections 116 and 118. In FIG. 3A, broken lines 117a and 119a respectively illustrate the characteristics of the low sensitivity light receiving sections 117 and 119 and vertical lines 121 represent the largest incident angle that is determined by the lens frame and the stop diameter of the imaging optical system.

FIG. 3B illustrates the areas on the exit pupil 120 where the luminous fluxes to be received by the respective light receiving sections pass.

In FIG. 3B, the areas 116b and 118b represent pupil areas where the luminous fluxes received by the high sensitivity light receiving sections 116 and 118 pass through, respectively. The areas 117b and 119b represent pupil areas where the luminous fluxes received by the low sensitivity light receiving sections 117 and 119 pass through, respectively.

The characteristics of the high sensitivity light receiving section 116 and the low sensitivity light receiving section 117 differ from each other in terms of maximum sensitivity. Similarly, the characteristics of the high sensitivity light receiving section 118 and the low sensitivity light receiving section 119 differ from each other in terms of maximum sensitivity.

By appropriately configuring the pupil dividing means 110 and 111, the high sensitivity light receiving sections 116 and 118 and the low sensitivity light receiving sections 117 and 119, the receiving sections can be made to represent the above-cited angle characteristics.

The reason why an imaging apparatus 100 according to the present invention enables highly accurate ranging to a high luminance or low luminance object and can acquire a high quality image of the object will be described below.

When the object represents a low luminance, only a small number of luminous fluxes enter the pixels 103 and 104. The high sensitivity light receiving sections 116 and 118 are so configured as to receive many of the luminous fluxes that enter the pixels 103 and 104 respectively at the photoelectric conversion sections 105 and 107 and additionally acquire ranging images from mutually different pupil areas.

Thus, if the object represents a low luminance, they can receive signals representing a high intensity and a large S/N ratio. Then, as a result, high quality signals can be obtained and precision ranging can be achieved. Therefore, the accuracy of the pixel values of the pixels 103 and 104 are improved by the high quality signals acquired by the high sensitivity light receiving sections 116 and 118 so that the imaging apparatus can pick up a high quality image.

When the object represents a high luminance, a large number of luminous fluxes enter the pixels 103 and 104. The low sensitivity light receiving sections 117 and 119 are so configured as to receive only part of the luminous fluxes that enter the pixels 103 and 104 respectively at the photoelectric conversion sections 106 and 108 and additionally acquire ranging images from mutually different pupil areas.

Therefore, the signal values are hardly saturated if the object represents a high luminance and hence accurate signals can be obtained.

Thus, high quality signals can be acquired and precision ranging can be achieved.

Furthermore, the accuracy of the pixel values of the pixels 103 and 104 is improved and hence a high quality image can be picked up by the high quality signals acquired at the low sensitivity light receiving sections 117 and 119.

As for an object representing an intermediate luminance, ranging can be achieved and an image of the object can be picked up by using the signals obtained by the high sensitivity light receiving sections 116 and 118 and/or the low sensitivity light receiving sections 117 and 119.

Thus, with the imaging apparatus 100 according to the present invention, precision ranging can be achieved and a high quality image of the object can be picked up by using the signals acquired by the high sensitivity light receiving sections 116 and 118 and the signals acquired by the low sensitivity light receiving sections 117 and 119 regardless if the object represents a low luminance or high luminance.

If the imaging optical system is equipped with a stop, the diameter of the stop is changed according to the imaging situation.

With the prior art arrangement, the quantity of light that enters each pixel falls when the diameter of the stop is reduced to degrade the S/N ratio of the signal acquired by each photoelectric conversion section.

To the contrary, with the arrangement of this embodiment, a signal representing a high S/N ratio can be obtained by the high sensitivity light receiving sections 116 and 118 if the diameter of the stop is reduced. Thus, as a result, precision ranging can be achieved and a high quality image of the object can be obtained.

As seen from FIGS. 3A and 3B, the low sensitivity light receiving section 117 and the high sensitivity light receiving section 118 receive the luminous flux that passes through a same pupil area while the low sensitivity light receiving section 119 and the high sensitivity light receiving section 116 receive the luminous flux that passes through a same pupil area but the light receiving sections have respective sensitivity characteristics that are different from each other.

With such a characteristic arrangement, the ranging images acquired respectively by each pair of a low sensitivity light receiving section and a high sensitivity light receiving section have a same shape but represent respective luminous intensities that are different from each other. The difference in the luminous intensity can be corrected by way of signal processing on the basis of the difference of their sensitivities between the two light receiving sections.

Then, as a result, ranging to an object representing an intermediate luminance can be achieved by using the signals acquired at the light receiving sections 116 and 117 or at the light receiving sections 118 and 119 that are contained in a same pixel so that precision ranging can be achieved.

Preferably, the light receiving sections have respective characteristics illustrated in FIGS. 4A and 4B.

FIGS. 4A and 4B illustrate the angle characteristic of each of the light receiving sections and the area on the exit pupil 120 through which the luminous flux to be received by each of the light receiving sections passes.

As illustrated in FIG. 4A, each of the low sensitivity light receiving sections 117 and 119 is so configured to have a sensitivity to a luminous flux that enters with a large angle and through a narrow angle range if compared with the high sensitivity light receiving sections 116 and 118.

As each of the low sensitivity light receiving sections 117 and 119 receives a luminous flux entering with a large angle, a ranging image can be acquired by means of luminous fluxes that pass through peripheral areas of the exit pupil 120. Such a ranging image changes its position to a large extent according to the distance to the object.

In other words, the base line length becomes large to allow precision ranging. Additionally, as each of the low sensitivity light receiving sections 117 and 119 receives a luminous flux entering with a narrow angle range, a ranging image can be obtained by means of a luminous flux that comes passing through a narrow area of the exit pupil.

An image of an object formed by such a luminous flux is hardly blurred if the object is located at a position off the focal position of the imaging lens. Thus, each of the low sensitivity light receiving sections 117 and 119 can acquire a clear ranging image.

Thus, high precision ranging to an object representing a high luminance or an intermediate luminance can be achieved by using the signals obtained by the low sensitivity light receiving sections 117 and 119.

If the imaging optical system is equipped with a stop, the low sensitivity light receiving sections can achieve precision ranging when the diameter of the stop is large, while the high sensitivity light receiving sections can achieve ranging when the diameter of the stop is small as they receive luminous fluxes from the center or nearby areas of the exit pupil.

By appropriately configuring the pupil dividing means 110 and 111, the high sensitivity light receiving sections 116 and 118 and the low sensitivity light receiving sections 117 and 119, the receiving sections can be made to represent the above-cited angle characteristics and provide the above-described advantages.

In the imaging apparatus 100 according to the present invention, the direction of arrangement of the light receiving sections of each pixel and the direction of dividing the pupil are not limited to the x-direction. In other words, they may be the y-direction or the xy-direction. The ranging to an object whose contrast changes in the y-direction or in the xy-direction can be achieved by arranging the light receiving sections of each pixel in the y-direction or in the xy-direction.

Figure 5A:
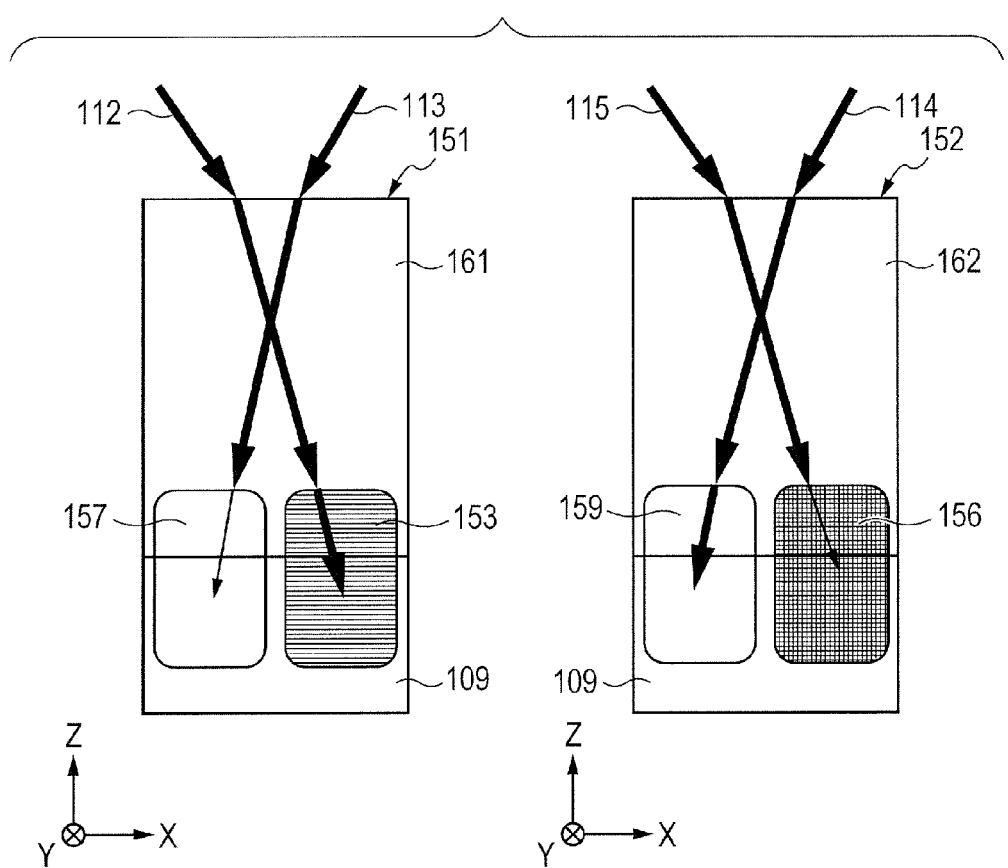
FIGS. 5A and 5B are views illustrating the configurations of pixels in the imaging apparatus according to the embodiment of the present invention.
Figure 5B:
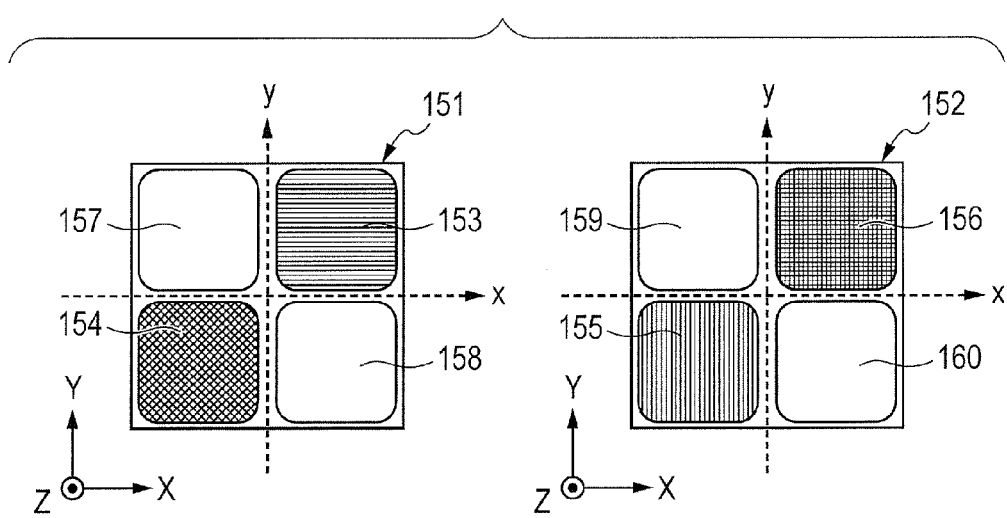

Alternatively, two high sensitivity light receiving sections and two low sensitivity light receiving sections may be arranged in each pixel. FIGS. 5A and 5B illustrate the configuration of pixel 151 and that of pixel 152, each having four light receiving sections. FIG. 5A illustrates xz cross-sectional views of the two pixels and FIG. 5B illustrates xy cross-sectional views of the two pixels.

The pixels have respective pupil dividing means 161 and 162.

The pixel 151 has high sensitivity light receiving section 153, low sensitivity light receiving section 154 and other two light receiving sections 157 and 158, while the pixel 152 has high sensitivity light receiving section 155, low sensitivity light receiving section 156 and other two light receiving sections 159 and 160.

Each of the light receiving sections has photoelectric conversion sections (not illustrated) in the substrate 109.

The high sensitivity light receiving section 153 and the low sensitivity light receiving section 154 contained in the pixel 151 and the high sensitivity light receiving section 155 and the low sensitivity light receiving section 156 contained in the pixel 152 have a mutually inverted positional relationship relative to the centers of the pixels in the pupil dividing directions (the x-direction and the y-direction).

FIGS. 6A through 6C illustrate the angle characteristic of each of the light receiving sections and the area on the exit pupil through which the luminous flux to be received by each of the light receiving sections passes. In the graphs of FIGS. 6A and 6B, the horizontal axes represent the angle of the luminous flux entering a pixel. More specifically, they represent the angle formed between the luminous flux and the z-axis standing from the xz-plane and the angle formed between the luminous flux and the z-axis standing from the yz-plane.

In the graphs of FIGS. 6A and 6B, the vertical axes represent the sensitivity of each of the light receiving sections. In FIGS. 6A and 6B, solid lines $153a$ and $155a$ respectively illustrate the characteristics of the high sensitivity light receiving sections 153 and 155 and solid lines $154a$ and $156a$ respectively illustrate the characteristics of the low sensitivity light receiving sections 154 and 156.

In FIGS. 6A and 6B, broken lines 157a, 158a, 159a and 160a respectively illustrate the characteristics of the other light receiving sections 157, 158, 159 and 160 and vertical lines 121 represent the largest incident angle that is determined by the lens frame and the stop diameter of the imaging optical system.

FIG. 6C illustrates the areas on the exit pupil 120 where the luminous fluxes to be respectively received by the respective light receiving sections pass through. Areas 153b and 155b are the pupil areas where the luminous fluxes to be respectively received by the high sensitivity light receiving sections 153 and 155 pass through. Areas 154b and 156b are the pupil areas through which the luminous fluxes to be respectively received by the low sensitivity light receiving sections 154 and 156 pass through.

Areas 157b, 158b, 159b, 160b are the pupil areas where the luminous fluxes to be respectively received by the other light receiving sections 157, 158, 159, 160 pass through.

The high sensitivity light receiving sections 153 and 155 receive a greater number of luminous fluxes than the low sensitivity light receiving sections 154 and 156.

With the above-described arrangement, the ranging to an object representing a high luminance or a low luminance whose contrast changes in the x-direction or in the y-direction can be achieved.

For an object representing a low luminance and whose contrast changes in the x-direction, the signals acquired by the high sensitivity light receiving section 153 and the other light receiving section 158 and the signals acquired by the high sensitivity light receiving section 155 and the other light receiving section 159 are added up separately.

For an object whose contrast changes in the y-direction, the signals obtained by the high sensitivity light receiving section 153 and the other light receiving section 157 and the signals acquired by the high sensitivity light receiving section 155 and the other light receiving section 160 are added up separately. The ranging can be achieved by using the signals obtained by the additions.

For an object representing a high luminance and whose contrast changes in the x-direction, the signals acquired by the low sensitivity light receiving section 154 and the other light receiving section 157 and the signals acquired by the low sensitivity light receiving section 156 and the other light receiving section 160 are added up separately.

For an object whose contrast changes in the y-direction, the signals obtained by the low sensitivity light receiving section 154 and the other light receiving section 158 and the signals acquired by the low sensitivity light receiving section 156 and the other light receiving section 159 are added up separately. The ranging can be achieved by using the signals obtained by the additions.

For generating a picked-up image, the pixel value of the pixel 151 can be obtained by using appropriate ones of the signals acquired by the high sensitivity light receiving section 153, the low sensitivity light receiving section 154 and the other light receiving sections 157 and 158 depending on the luminance of the object.

Similarly, the pixel value of the pixel 152 can be obtained by using appropriate ones of the signals acquired by the high sensitivity light receiving section 155, the low sensitivity light receiving section 156 and the other light receiving sections 159 and 160.

Note that the characteristics of the high sensitivity light receiving sections and those of the low sensitivity light receiving sections are not limited to those illustrated in FIGS. 6A and 6B.

As pointed out earlier, the high sensitivity light receiving section 153 and the low sensitivity light receiving section 156 may be so configured as to receive the luminous flux that passes through a same pupil area but have respective sensitivity characteristics that are different from each other, while the high sensitivity light receiving section 154 and the low sensitivity light receiving section 155 may be so configured as to receive the luminous flux that passes through a same pupil area but have respective sensitivity characteristics that are different from each other.

This arrangement provides advantages that are same as the above-described ones.

When a plurality of photoelectric conversion sections are arranged in each pixel of an imaging apparatus 100 according to the present invention as in the case of pixel 103 and pixel 104, pixel signals for a picked up image can be prepared by using the signals acquired by the photoelectric conversion sections of each pixel.

When such pixels are used for all the pixels of the image sensor 101, a distance image and a picked-up image can be produced simultaneously.

As used herein, the expression of all the pixels of the image sensor means all the pixels that are substantially engaged in producing a picked-up image (signals for picking an image of an object) and refers to all the pixels arranged in the image area, or all the pixels that are counted as effective pixels. In other words, the pixels arranged in one or more than one areas where a light shield film is arranged so as not to be irradiated with light for the purpose of noise reduction (so called optical black areas) and the so called ring pixels that are arranged adjacent to the image area to draw out information necessary for image processing are excluded.

As all the pixels of the image sensor are provided with a feature of producing ranging signals, distance information (a distance map) on the object can be obtained for the position of each pixel. Then, the picked-up image can be processed to intentionally provide it, for example, with blurring as post-imaging processing on the basis of the obtained minute distance map. Additionally, as the light receiving sections (pixels) dedicated for acquiring image signals are eliminated, the image sensor can be prepared more easily because the image sensor then requires a reduced number of different types of light receiving sections.

Additionally, the distance to an arbitrary imaging area (object) can be measured by way of a ranging operation using the signals extracted from an arbitrary pixel group of the image sensor 101.

Alternatively, pixels same as the pixel 103 and those same as the pixel 104 may be arranged as part of the pixels of the image sensor 101 and pixels for acquiring images may be used for the remaining pixels.

Then, the number of ranging pixels can be reduced to consequently improve the quality of the picked-up image.

The pixel 103 and the pixel 104 are desirably arranged near to each other because they receive part of the luminous fluxes from an object for ranging. They are arranged preferably within the area of four pixels, more preferably within the area of two pixels.

For the purpose of detecting the amounts of discrepancies of ranging images, a plurality of pixels 103 and a plurality of pixels 104 are desirably arranged at predetermined pixel intervals in the pupil dividing direction. They are arranged at pixel intervals preferably of 8 pixels or less, more preferably of 2 pixels or less.

Pixels 103 and pixels 104 are desirably arranged on a same pixel row in a direction perpendicular to the pupil dividing direction (the y-direction in FIG. 1B).

The differences among the shapes of the ranging images acquired by the pixels 103 and the pixels 104 can be minimized and the ranging can be achieved highly accurately by making the positions for acquiring ranging images as close as possible to each other in the pupil dividing direction.

Figure 7A:
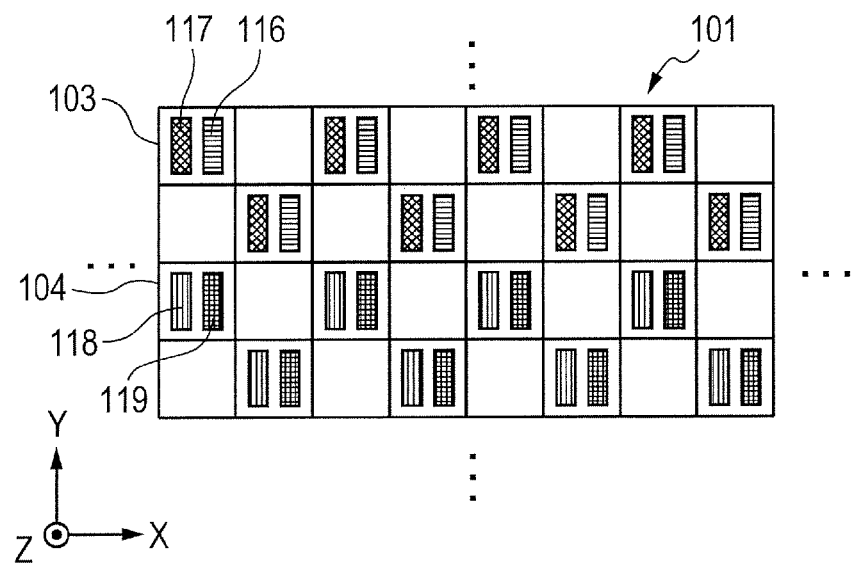
FIGS. 7A and 7B are views illustrating arrangement of pixels in the imaging apparatus according to the embodiment of the present invention.
Figure 7B:
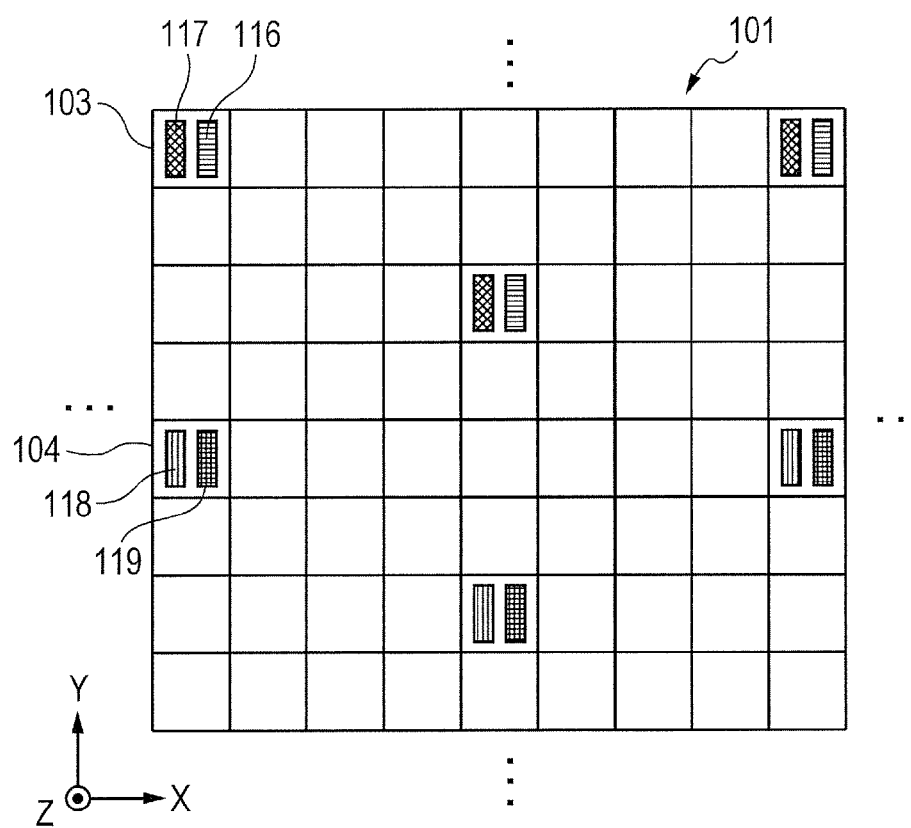

FIGS. 7A and 7B illustrate exemplary arrangements of pixels.

FIG. 7A illustrates an instance where pixels 103 and pixels 104 are arranged at two pixel intervals in the pupil dividing direction (x-direction) and pixels 103 and pixels 104 are arranged on every other pixel row in a direction perpendicular to the pupil dividing direction (y-direction).

With the arrangement of FIG. 7A, which is the Bayer arrangement, ranging pixels can be arranged at pixels of a particular color.

FIG. 7B illustrates an instance where pixels 103 and pixels 104 are arranged at 8-pixel intervals in the pupil dividing direction (x-direction) and pixels 103 and pixels 104 are arranged on every fourth pixel row in a direction perpendicular to the pupil dividing direction (y-direction). With such a discrete arrangement of pupils 103 and pupils 104, ranging operations can be conducted with a small number of ranging pixels.

Note that, an imaging apparatus 100 according to the present invention may be so configured that each pupil dividing means 110 guides the luminous flux from the area of a part of the exit pupil 120 to both the photoelectric conversion section 105 and the photoelectric conversion section 106 and the pupil dividing means 111 guides the luminous flux from the area of a part of the exit pupil 120 that is different from the former part to both the photoelectric conversion section 107 and the photoelectric conversion section 108. The use of such pupil dividing means also provides the above-described advantages of the present invention.

EXAMPLES

Now, the present invention will be described further by way of examples.

Example 1

A configuration example that is applicable to an imaging apparatus according to the present invention will be described below as Example 1.

Figure 8:
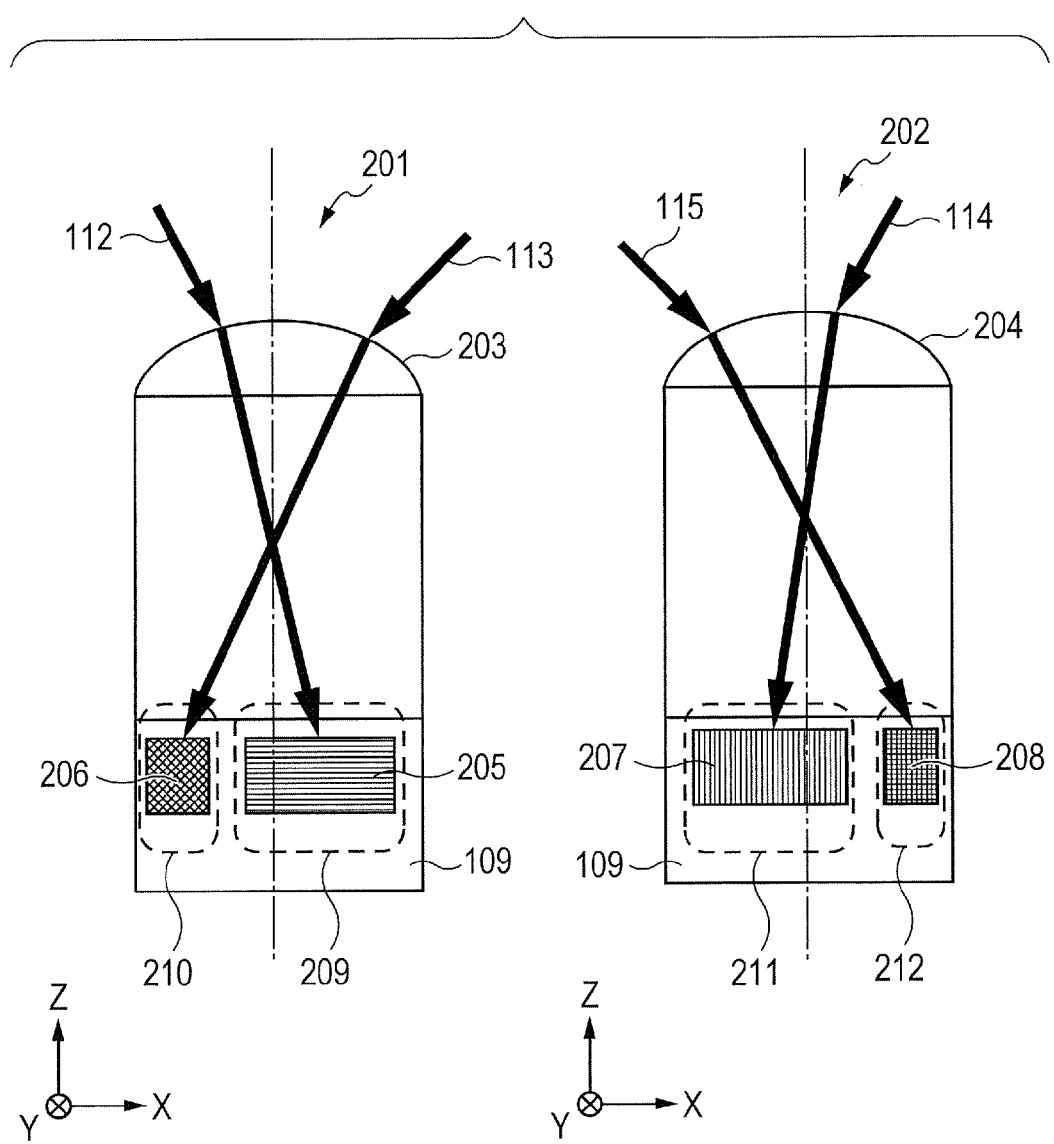
FIG. 8 is a schematic illustration of the configurations of pixels of the imaging apparatus according to Example 1 of the present invention.

FIG. 8 illustrates the configuration of pixel 201 and that of pixel 202 of the image sensor of the imaging apparatus of this example.

Pixel 201 of the imaging apparatus of this example includes photoelectric conversion sections 205 and 206 arranged in the substrate 109 and a microlens 203 is arranged above them as pupil dividing means.

Pixel 202 of the imaging apparatus includes photoelectric conversion sections 207 and 208 in the substrate 109 and a microlens 204 is arranged above them as pupil dividing means.

The microlens 203 is so configured as to make exit pupil 120 have a conjugated relation with the photoelectric conversion sections 205 and 206, while the microlens 204 is so configured as to make the exit pupil 120 have a conjugated relation with the photoelectric conversion sections 207 and 208.

The photoelectric conversion sections 205 and 207 have respective light receiving areas larger than the photoelectric conversion sections 206 and 208 in a plane parallel to the image pickup plane of the apparatus.

Additionally, the photoelectric conversion sections 206 and 208 are located at respective positions that are more remote from the respective centers of the pixels than the photoelectric conversion sections 205 and 207.

In pixel 201, a high sensitivity light receiving section 209 includes the photoelectric conversion section 205, and a low sensitivity light receiving section 210 includes the photoelectric conversion section 206.

In pixel 202, on the other hand, a high sensitivity light receiving section 211 includes the photoelectric conversion section 207, and a low sensitivity light receiving section 212 includes the photoelectric conversion section 208.

The high sensitivity light receiving section 209 and the low sensitivity light receiving section 210 of the pixel 201 and the high sensitivity light receiving section 211 and the low sensitivity light receiving section 212 of the pixel 202 are mutually positionally inverted relative to the centers of the pixels as viewed in the pupil dividing direction.

Of the luminous fluxes that are made to enter the pixel 201 by the imaging lens 102, the luminous flux 112 is converged toward the photoelectric conversion section 205, and the luminous flux 113 is converged toward the photoelectric conversion section 206 by the microlens 203.

Similarly, of the luminous fluxes that are made to enter the pixel 202 by the imaging lens 102, the luminous flux 114 is converged toward the photoelectric conversion section 207, and the luminous flux 115 is converged toward the photoelectric conversion section 208 by the microlens 204.

The photoelectric conversion sections 205 and 207 and the photoelectric conversion sections 206 and 208 receive luminous fluxes from respective pupil areas that are different from each other.

As a microlens is provided as pupil dividing means and arranged above the photoelectric conversion sections of each pixel, luminous fluxes that pass through different pupil areas can be guided to the different photoelectric conversion sections so that the pupil dividing feature can be realized with ease.

Since the photoelectric conversion sections 206 and 208 have a small light receiving area that operates for photoelectric conversion, the luminous fluxes that are converged by the microlenses 203 and 204 are partly converted into electric signals.

On the other hand, since the photoelectric conversion sections 205 and 207 have a large light receiving area that operate for photoelectric conversion, they can receive a large quantity of light.

Additionally, the luminous fluxes that pass the periphery of the exit pupil 120 lose some quantity of light as a result of vignetting caused by the lens frame and the stop.

The luminous fluxes from the periphery of the exit pupil are focused at positions separated from the centers of the pixels by the microlenses 203 and 204.

When the photoelectric conversion sections 206 and 208 are arranged at positions remote from the respective centers of the pixels, the quantity of light that each of them receives falls to make it represent a low sensitivity characteristic.

When, on the other hand, the photoelectric conversion sections 205 and 207 are arranged at positions close to the centers of the pixels, the fall of the quantity of light can be prevented and a high sensitivity characteristic can be realized.

As described above, high quality signals can be acquired by the high sensitivity light receiving sections 209 and 211 for a low luminance object, while high quality signals can be acquired by the low sensitivity light receiving sections 210 and 212 for a high luminance object.

An accurate ranging operation can be conducted and a high quality image can be produced by these signals.

A high sensitivity light receiving section and a low sensitivity light receiving section can be formed with ease by arranging, in each pixel, a pair of photoelectric conversion sections having different light receiving surface areas or different distances to the center of the pixel.

The area in a pixel that does not operate for photoelectric conversion can be reduced and the highest sensitivity of the high sensitivity light receiving section can be raised by providing photoelectric conversion sections having a large light receiving area.

Then, as a result, high quality signals can be obtained with a very large S/N ratio for an object representing a low luminance or an intermediate luminance.

As for the luminous fluxes that enter each pixel, the luminous flux that enters with a small angle is converged to or near the center of the pixel and the luminous flux that enters with a large angle is converged to or near the periphery of the pixel by the microlenses 203 and 204.

When the area of the photoelectric conversion sections 206 and 208 is reduced, only luminous fluxes that are found in a narrow angle range are received.

When, on the other hand, the photoelectric conversion sections 206 and 208 are arranged at positions remote from the center of the pixel, luminous fluxes entering the pixel with a large angle are received.

Then, the angle characteristics of the low sensitivity light receiving sections 210 and 212 are such that they are sensitive to luminous fluxes that are found in a narrow angle range and enter the pixel with a large angle.

Contrary to the low sensitivity light receiving sections 210 and 212, the angle characteristics of the high sensitivity light receiving sections 209 and 211 are such that they are sensitive to luminous fluxes that are found in a broad angle range and enter the pixel with a small angle.

With the above-described arrangement, the light receiving sections represent characteristics as illustrated in FIGS. 4A and 4B. As pointed out earlier, high precision ranging to an object representing a high luminance or an intermediate luminance can be achieved by using the signals acquired by the low sensitivity light receiving sections 210 and 212.

Figure 9:
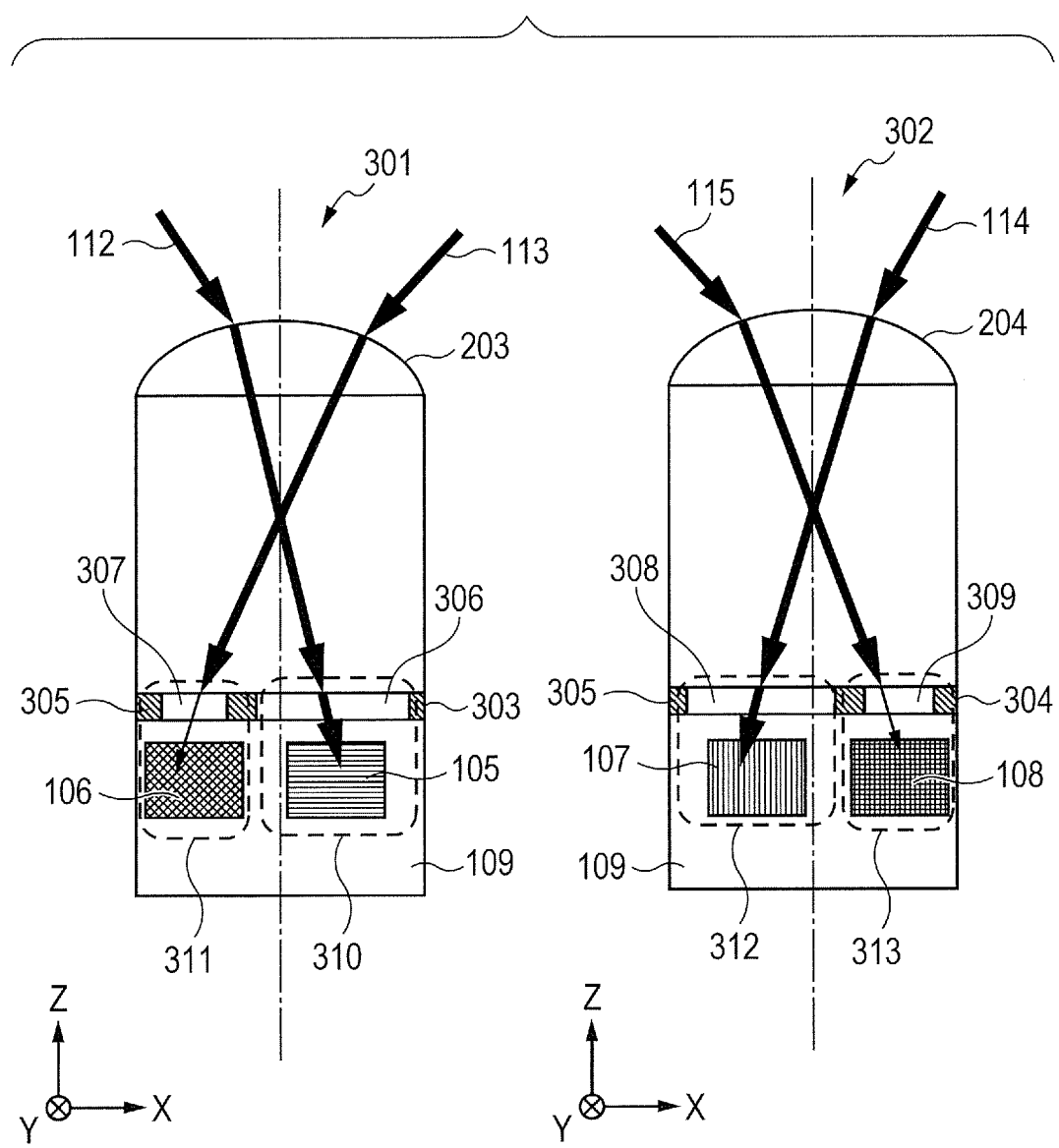
FIG. 9 is another schematic illustration of the configurations of pixels of the imaging apparatus according to Example 1 of the present invention.

FIG. 9 schematically illustrates the configuration of a pair of pixels in the image sensor 301 of the imaging apparatus 100 of this example.

Pixel 301 of the imaging apparatus 100 of this example has photoelectric conversion sections 105 and 106 arranged in the substrate 109, a microlens 203 that operates as pupil dividing means and a filter 303 disposed between the microlens 203 and the photoelectric conversion sections 105 and 106.

Similarly, pixel 302 has photoelectric conversion sections 107 and 108 arranged in the substrate 109, a microlens 204 that operates as pupil dividing means and a filter 304 disposed between the microlens 204 and the photoelectric conversion sections 107 and 108.

The filters 303 and 304 represent respective transmittances that are different from each other in the planes of the pixels (xy planes). The filters 303 and 304 are formed by respective light shielding members and respectively have a pair of opening portions 306 and 307 and a pair of opening portions 308 and 309. The opening portions 306, 307, 308 and 309 are arranged above the respective photoelectric conversion sections 105, 106, 107 and 108.

The opening portions 306 and 308 have an opening width greater than the opening portions 307 and 309, respectively. Additionally, the opening portions 307 and 309 are arranged at respective positions that are more remote from the respective centers of the pixels than the opening portions 306 and 308.

In the pixel 301, a high sensitivity light receiving section 310 is formed by the opening portion 306 and the photoelectric conversion section 105, while a low sensitivity light receiving section 311 is formed by the opening portion 307 and the photoelectric conversion section 106. In the pixel 302, a high sensitivity light receiving section 312 is formed by the opening portion 308 and the photoelectric conversion section 107, while a low sensitivity light receiving section 313 is formed by the opening portion 309 and the photoelectric conversion section 108.

The high sensitivity light receiving section 310 and the low sensitivity light receiving section 311 of the pixel 301 and the high sensitivity light receiving section 312 and the low sensitivity light receiving section 313 of the pixel 302 are mutually positionally inverted relative to the centers of the pixels as viewed in the pupil dividing direction.

As pointed out above, the photoelectric conversion sections 105 and 107 and the photoelectric conversion sections 106 and 108 are made to receive luminous fluxes from respective pupil areas that are different from each other by the microlenses 203 and 204. Part of the converged light passes through the opening portions 306, 307, 308 and 309 of the filters 303 and 304 and gets to the photoelectric conversion sections 105, 106, 107 and 108.

When the opening portions of a pixel have a large opening width and arranged near the center of the pixel, the photoelectric conversion sections of the pixel receive a large quantity of light.

The photoelectric conversion sections 105 and 107 receive a greater quantity of light than the photoelectric conversion sections 106 and 108. A high sensitivity light receiving section and a low sensitivity light receiving section are formed in each pixel by means of such an arrangement. As a result, precision ranging to a high luminance object or a low luminance object can be achieved and a high quality image of the object can be produced as pointed out earlier.

A high sensitivity light receiving section and a low sensitivity light receiving section can be formed in a pixel with ease by arranging filters of light shielding members above the respective photoelectric conversion sections and providing them with opening portions having different opening widths or different opening positions.

As described above, when the opening portions 307 and 309 of the low sensitivity light receiving sections 311 and 313 are made to have a small opening width, they receive respective luminous fluxes entering the pixel only through a narrow angle range.

On the other hand, the opening portions 307 and 309 are made to receive respective luminous fluxes entering the pixel with a large angle when they are arranged at positions remote from the center of the pixel.

Thus, with such an arrangement, the light receiving sections are made to represent angle characteristics as illustrated in FIGS. 4A and 4B.

Then, as a result of such an arrangement, the high precision ranging to an object representing a high luminance or an intermediate luminance can be achieved by using the signals acquired at the low sensitivity light receiving sections 311 and 313.

Example 2

Now, an exemplary configuration of an imaging apparatus that is realized in a mode different from the imaging apparatus of Example 1 will be described below.

Figure 10:
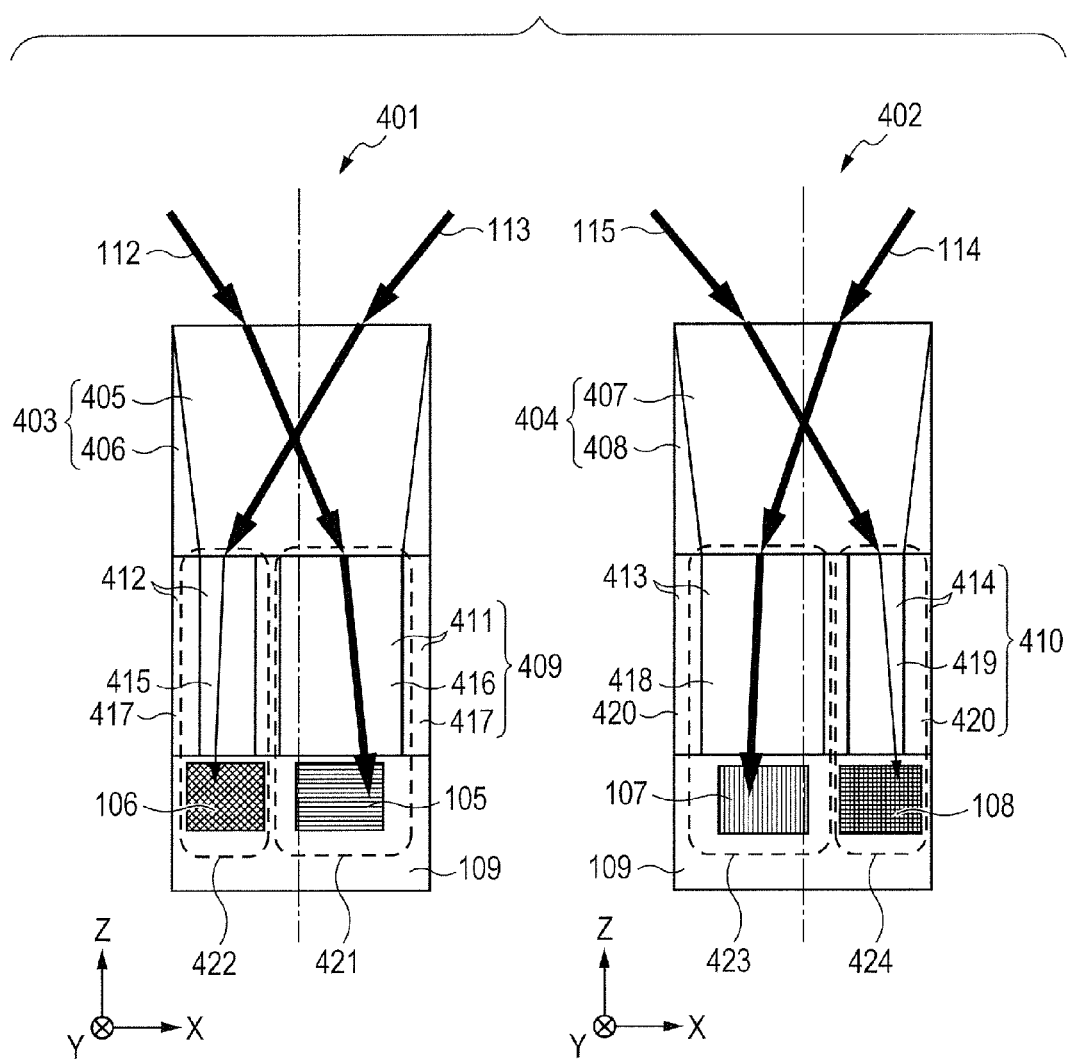
FIG. 10 is a schematic illustration of the configurations of pixels of the imaging apparatus according to Example 2 of the present invention.

FIG. 10 illustrates the configuration of pixel 401 and that of pixel 402 of the image sensor of the imaging apparatus of this example.

Pixel 401 of the imaging apparatus of this example includes photoelectric conversion sections 105 and 106 arranged in the substrate 109 and an optical waveguide 403 arranged above them as pupil dividing means. Similarly, pixel 402 includes photoelectric conversion sections 107 and 108 arranged in the substrate 109 and an optical waveguide 404 arranged above them as pupil dividing means.

Additionally, in the pixel 401, a filter 409 in which optical waveguides 411 and 412 are arranged is disposed between the optical waveguide 403 and the photoelectric conversion sections 105 and 106. Similarly, in the pixel 402, a filter 410 in which optical waveguides 413 and 414 are arranged is disposed between the optical waveguide 404 and the photoelectric conversion sections 107 and 108.

The optical waveguides 403 and 404 respectively include core sections 405 and 407 and clad sections 406 and 408.

The filter 409 is formed by the optical waveguides 411 and 412, which respectively have core sections 415 and 416 and clad sections 417. The filter 410 is formed by the optical waveguides 413 and 414, which respectively have core sections 418 and 419 and clad sections 420.

The core sections 415 and 416 of the optical waveguides included in the filter 409 are connected to the core section 405 of the optical waveguide 403, while the core sections 418 and 419 of the optical waveguides included in the filter 410 are connected to the core section 407 of the optical waveguide 404.

The core sections 416 and 418 have core diameters respectively greater than the core sections 415 and 419.

Additionally, the core sections 415 and 419 are arranged at positions more remote from the respective centers of the pixels than the core sections 416 and 418.

The core sections 405, 407, 415, 416, 418 and 419 are formed by a medium having a refractive index higher than the corresponding clad sections 406, 408, 417 and 420.

The core sections and the clad sections are formed by a material that is transparent in the wavelength band to be used for image pickup operations. For example, they are formed by $SiO_2$, SiN or an organic material.

With the above-described arrangement, light can be confined within the insides of the optical waveguides for propagation.

In the pixel 401, a high sensitivity light receiving section 421 is formed by the optical waveguide 411 and the photoelectric conversion section 105 and a low sensitivity light receiving section 422 is formed by the optical waveguide 412 and the photoelectric conversion section 106.

In the pixel 402, a high sensitivity light receiving section 423 is formed by the optical waveguide 413 and the photoelectric conversion section 107 and a low sensitivity light receiving section 424 is formed by the optical waveguide 414 and the photoelectric conversion section 108.

The high sensitivity light receiving section 421 and the low sensitivity light receiving section 422 of the pixel 401 and the high sensitivity light receiving section 423 and the low sensitivity light receiving section 424 of the pixel 402 are mutually positionally inverted relative to the centers of the pixels.

Luminous flux 112 that enters the pixel 401 from the first direction is subjected to mode conversion so as to be converted into the waveguide mode of the optical waveguide 403 and propagated through the optical waveguide 403. Then, it is further subjected to waveguide mode coupling with the waveguide mode of the optical waveguide 411 and propagated through the optical waveguide 411.

On the other hand, luminous flux 113 that enters the pixel 401 from the second direction is subjected to mode conversion so as to be converted into the waveguide mode of the optical waveguide 403 and propagated through the optical waveguide 403. Then, it is further subjected to waveguide mode coupling with the waveguide mode of the optical waveguide 412 and propagated through the optical waveguide 412.

A waveguide mode is expressed as the sum of a plurality of intrinsic modes that an optical waveguide has and indicates the state of propagation in the optical waveguide.

The intrinsic modes are uniquely determined as a function of the shape and the refractive index of the core and those of the clad of the optical waveguide. As luminous fluxes 112 and 113 enter the optical waveguide 403, they are subjected to coupling with the plurality of intrinsic modes and propagated through the optical waveguide in the intrinsic waveguide mode.

The ratio of the intrinsic modes that constitute the waveguide mode varies as a function of incident angle and the electric field distribution of the waveguide mode varies accordingly.

Thus, the luminous fluxes can be made to propagate in a waveguide mode whose electric field distribution varies as a function of incident angle by appropriately selecting the shape and the medium of the optical waveguide 403.

Additionally, the luminous fluxes that enter the pixel with different incident angles can be made to propagate to the optical waveguides 411 and 412 by subjecting the waveguide mode for propagation through the optical waveguide 403 to coupling with the waveguide modes of the optical waveguides 411 and 412.

The luminous fluxes transmitted through the optical waveguides 411 and 412 are received respectively by the photoelectric conversion sections 105 and 106.

Thus, luminous fluxes from different pupil areas can be guided to the photoelectric conversion sections 105 and 106 by means of the optical waveguide 403.

Similarly, the luminous fluxes 114 and 115 can be guided to the photoelectric conversion sections 107 and 108 by means of the optical waveguide 404.

The coupling efficiency among the waveguide modes of the optical waveguide 403 and the optical waveguides 411 and 412 is raised when the electric field distributions of the waveguide modes are close to each other at the connecting sections of the optical waveguide 403 and the optical waveguides 411 and 412.

Many waveguide modes can exist in the optical waveguide 411 when the core diameter of the optical waveguide 411 is large. Then, the number of waveguide modes that can be coupled with the waveguide mode of the optical waveguide 403 rises.

Thus, the quantity of light that is propagated through the optical waveguide 411 from the optical waveguide 403 and gets to the photoelectric conversion section 105 increases.

On the other hand, the number of waveguide modes available in the optical waveguide 411 falls when the core diameter of the optical waveguide 411 becomes small. Thus, the quantity of light that is propagated through the optical waveguide 411 and gets to the photoelectric conversion section 105 decreases.

Similarly, the photoelectric conversion section 107 of the pixel 402 receives a larger quantity of light than the photoelectric conversion section 108.

With the above-described arrangement, a high sensitivity light receiving section and a low sensitivity light receiving section are formed in each pixel. Then, as described above, precision ranging to an object representing a high luminance or a low luminance can be achieved and a high quality image of the object can be produced.

The coupling efficiency among the waveguide modes falls when the core diameters of the optical waveguides 412 and 414 are reduced. Then, only luminous fluxes entering them through a narrow angle range are coupled with the waveguide modes of the optical waveguides 412 and 414 and received by the photoelectric conversion sections 106 and 108.

Among the luminous fluxes that enter the optical waveguides 403 and 404, the electric fields of those that enter the optical waveguides 403 and 404 at a small angle from the z-axis are liable to be concentrated at and near the center of the respective pixels while the electric fields of those that enter the optical waveguides 403 and 404 at a large angle from the z-axis are liable to be concentrated at and near the periphery of the respective pixels.

When the core sections 415 and 419 of the optical waveguides 412 and 414 are arranged at positions remote from the respective centers of the respective pixels, the luminous fluxes that enter them at a large angle are liable to be coupled with the waveguide modes of the optical waveguides 412 and 414.

Then, as a result, the angle characteristics of the low sensitivity light receiving sections 422 and 424 are such that they are sensitive to luminous fluxes entering them through a narrow angle range and at a large angle. Contrary to the low sensitivity light receiving sections 422 and 424, the angle characteristics of the high sensitivity light receiving sections 421 and 423 are such that they are sensitive to luminous fluxes entering them through a wide angle range and at a small angle.

Thus, with such an arrangement, the light receiving sections represent characteristics as illustrated in FIGS. 4A and 4B. Then, as described above, high precision ranging to an object representing a high luminance or an intermediate luminance can be achieved by using the signals acquired at the low sensitivity light receiving sections 422 and 424.

Although not illustrated in FIG. 10, each pixel is provided with wiring to be used for extracting the electric signals acquired at the photoelectric conversion sections of the pixel.

As the pixel size is reduced, the area through which light can be propagated is reduced by the wiring. However, when the pupil dividing means is formed by an optical waveguide of the above-described type, light can be strongly confined to the core section of the optical waveguide and propagated. Then, if the pixel size is small, the influence of the wiring can be minimized and the luminous fluxes entering the pixel can efficiently be guided to the photoelectric conversion sections.

Light that is propagated through the optical waveguides 411, 412, 413 and 414 of the filters 409 and 410 is confined to the insides of the optical waveguides and allowed to be emitted into the substrate 109 in a state where it is suppressed against spatially spreading.

Then, as a result, the distribution of light emitted into the substrate 109 is limited. By appropriately arranging a photoelectric conversion section under each optical waveguide, light in each of the optical waveguides can be emitted into an area where a photoelectric conversion section is located so that light can be efficiently received. The waveguide mode of each optical waveguide is determined by the shape, the medium and the location of the optical waveguide. Thus, the above-described advantages can be obtained by appropriately arranging the optical waveguides of this example.

The core sections of the optical waveguides 403 and 404 preferably have a tapered profile such that the widths of the core sections are increased toward their light receiving ends (in the direction toward the respective imaging lenses). By making the core sections have a tapered profile, a space for arranging the wiring for extracting electric signals therein can be secured although not illustrated in FIG. 10.

Then, additionally, light can be made to be propagated through specific areas in the pixels by means of the optical waveguides 403, 404, 411, 412, 413 and 414 to reduce crosstalks that are produced as light leaks to adjacent pixels.

Items that can be used to form the pupil dividing means, the high sensitivity light receiving sections and the low sensitivity light receiving sections of the imaging apparatus of this example are not limited to the above-described ones.

For example, optical waveguides may be used as pupil dividing means and the high sensitivity light receiving sections and the low sensitivity light receiving sections may be formed by arranging photoelectric conversion sections whose light receiving areas or positions differ from each other or by arranging filters having opening portions in the light shielding members at the light emitting sides of the optical waveguides.

Alternatively, microlenses may be used as pupil dividing means and filters formed by optical waveguides may be arranged as means for forming the high sensitivity light receiving sections and the low sensitivity light receiving sections near the imaging surfaces of the microlenses. Still alternatively, any of the above-described plurality of means may be combined to form the high sensitivity light receiving sections and the low sensitivity light receiving sections.

With this combination, the pupil division feature, high sensitivity light receiving sections and low sensitivity light receiving sections can be formed, and the above-described advantages can be obtained.

While a front surface irradiation type image sensor formed by arranging a pupil dividing means and light receiving sections at the front side of the substrate 109 is described above for this example, a rear surface irradiation type image sensor may alternatively be used for an image sensor for the purpose of the present invention.

To form a rear surface irradiation type image sensor, a pupil dividing means, high sensitivity light receiving sections and low sensitivity light receiving sections and photoelectric conversion sections are arranged in the substrate 109 sequentially from the rear side of the substrate 109.

With the above-described arrangement, the image sensor can be provided with a pupil dividing feature and the functional features of high sensitivity light receiving sections and low sensitivity light receiving sections to achieve the above-described advantages.

With the above-described arrangement, light (propagating in the +z direction) that enters the substrate from the rear side is detected.

Wiring and other components can be arranged at the front side of the substrate 109 to avoid a situation where incident light is prevented from being propagated by the wiring and other components.

Additionally, the spatial restrictions for forming optical waveguides due to wiring and other components is lessened and optical waveguides can be designed more freely in terms of the shapes thereof. Then, incident light can be efficiently guided to photoelectric conversion sections.

Example 3

An exemplary configuration of an imaging apparatus realized in a mode of carrying out the present invention that is different from those of the above-described examples will be described as Example 3.

Figure 11:
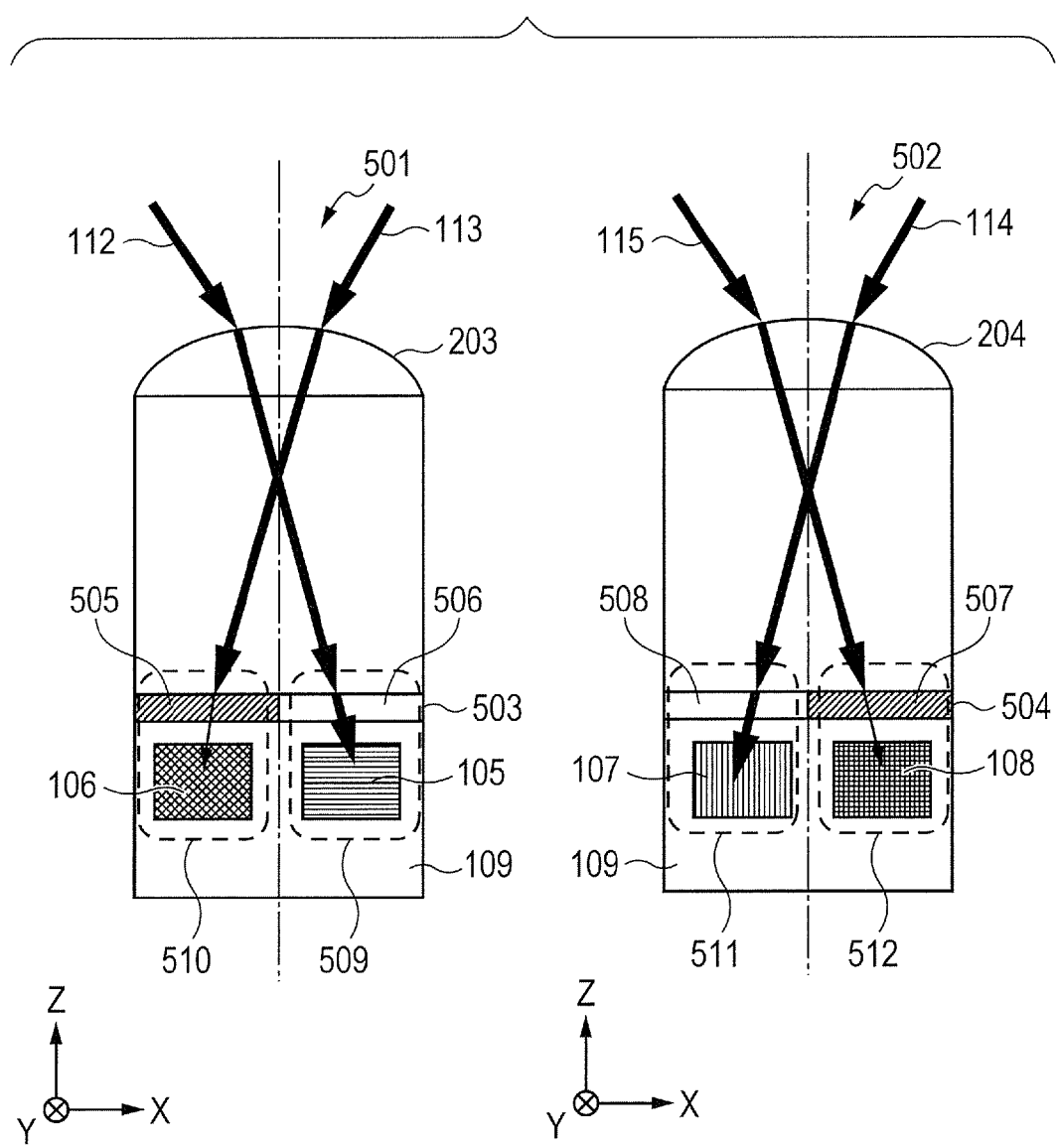
FIG. 11 is a schematic illustration of the configurations of pixels of the imaging apparatus according to Example 3 of the present invention.

FIG. 11 schematically illustrates the configuration of pixel 501 and pixel 502 of the image sensor of the imaging apparatus of this example. A filter formed by using an absorbent material is arranged in each pixel as means for forming a high sensitivity light receiving section and a low sensitivity light receiving section.

In pixels 501 and 502 of the image sensor of the imaging apparatus of this example, microlenses 203 and 204, substrate 109, photoelectric conversion sections 105, 106, 107 and 108 are same as their counterparts of the above-described examples.

The filters 503 and 504 represent respective transmittances that are different from each other in the planes of the pixels (xy planes). A part of the filter 503 located above the photoelectric conversion section 106 is formed by an absorbing medium 505 and a part thereof located above the photoelectric conversion section 105 is formed by a non-absorbing medium 506.

A part of the filter 504 located above the photoelectric conversion section 108 is formed by an absorbing medium 507 and a part thereof located above the photoelectric conversion section 107 is formed by a non-absorbing medium 508.

In the pixel 501, the high sensitivity light receiving section 509 is formed by the non-absorbing medium 506 and the photoelectric conversion section 105 and the low sensitivity light receiving section 510 is formed by the absorbing medium 505 and the photoelectric conversion section 106.

In the pixel 502, the high sensitivity light receiving section 511 is formed by the non-absorbing medium 508 and the photoelectric conversion section 107 and the low sensitivity light receiving section 512 is formed by the absorbing medium 507 and the photoelectric conversion section 108.

The high sensitivity light receiving section 509 and the low sensitivity light receiving section 510 of the pixel 501 and the high sensitivity light receiving section 511 and the low sensitivity light receiving section 512 of the pixel 502 are mutually positionally inverted relative to the centers of the pixels as viewed in the pupil dividing direction.

Of the luminous fluxes that are converged by the microlenses 203 and 204, the luminous fluxes directed toward the photoelectric conversion sections 106 and 108 are absorbed by the absorbing mediums 505 and 507 and partly received by the photoelectric conversion sections 106 and 108.

The luminous fluxes that are converged toward the photoelectric conversion sections 105 and 107 are allowed to pass through the non-absorbing mediums 506 and 508 and received by the photoelectric conversion sections 105 and 107.

Thus, the high sensitivity light receiving sections 509 and 511 receive a larger quantity of light than the low sensitivity light receiving sections 510 and 512.

The quantity of light that each of the photoelectric conversion sections receives is determined as a function of the absorption coefficient and the thickness of the absorbing medium.

The high sensitivity light receiving sections and the low sensitivity light receiving sections can be formed with ease by appropriately arranging filters 503 and 504.

With the above-described arrangement, precision ranging to an object representing a high luminance or a low luminance can be achieved and a high quality image of the object can be produced just like the instances that are described earlier.

Additionally, with the above-described arrangement, the light receiving sections represent angle characteristics as illustrated in FIGS. 3A and 3B. Then, as described above, ranging to an object representing an intermediate luminance can be achieved by using the signals acquired at the high sensitivity light receiving sections and at the low sensitivity light receiving sections contained in the same pixels so that precision ranging can be achieved.

Note that the configuration of the high sensitivity light receiving sections and that of the low sensitivity light receiving sections are not limited to those described above for this example.

Alternatively, for example, the high sensitivity light receiving sections and the low sensitivity light receiving sections may be configured such that the thickness of the photoelectric conversion sections 105 and 107 is made greater than that of the photoelectric conversion sections 106 and 108 in a direction perpendicular to the imaging plane instead of configuring the filters 503 and 504 in the above-described manner.

Light that enters each of the photoelectric conversion sections is propagated through the photoelectric conversion section and partly converted into electrons.

The quantity of light that is converted into electrons changes as light is transmitted through the photoelectric conversion section and the sensitivity thereof changes accordingly as a function of the thickness of the photoelectric conversion section. The quantity of light that the photoelectric conversion sections 105 and 107 receive can be made greater than the quantity of light that the photoelectric conversion sections 106 and 108 receive by appropriately selecting the thicknesses of the photoelectric conversion sections. Alternatively, the high sensitivity light receiving sections and the low sensitivity light receiving sections may be configured such that the exposure time of the photoelectric conversion sections 105 and 107 is longer than the exposure time of the photoelectric conversion sections 106 and 108.

The exposure time of each of the photoelectric conversion sections can be controlled by arranging a shutter and controlling the time during which light is allowed to enter it or by controlling the timing at which the electric charge accumulated in the photoelectric conversion section is read out.

The high sensitivity light receiving sections and the low sensitivity light receiving sections can be formed by any of the above-described means.

Example 4

Now, an exemplary configuration of an imaging apparatus according to the present invention will be described as Example 4.

Figure 12A:
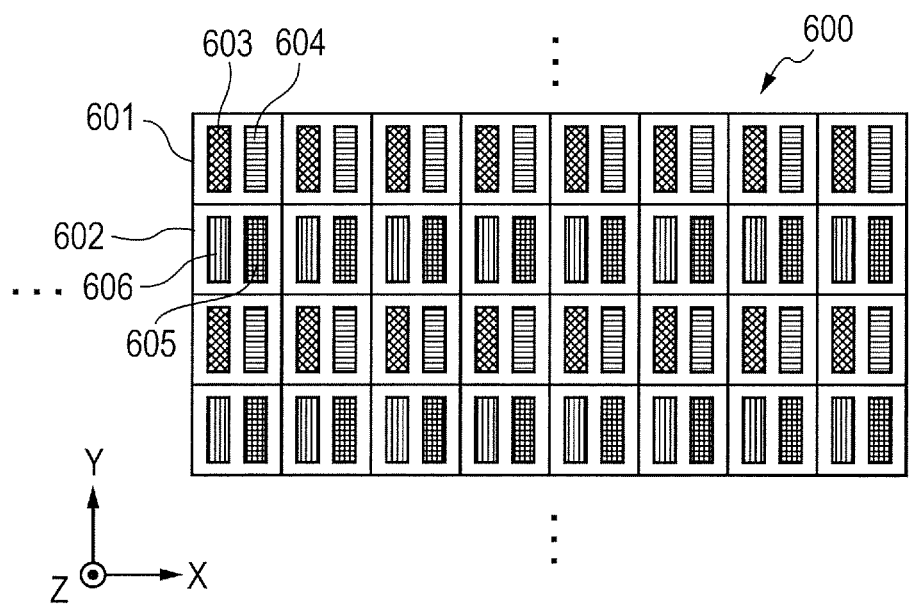
FIGS. 12A and 12B are views illustrating the configurations of pixels of the imaging apparatus according to Example 4 of the present invention.
Figure 12B:
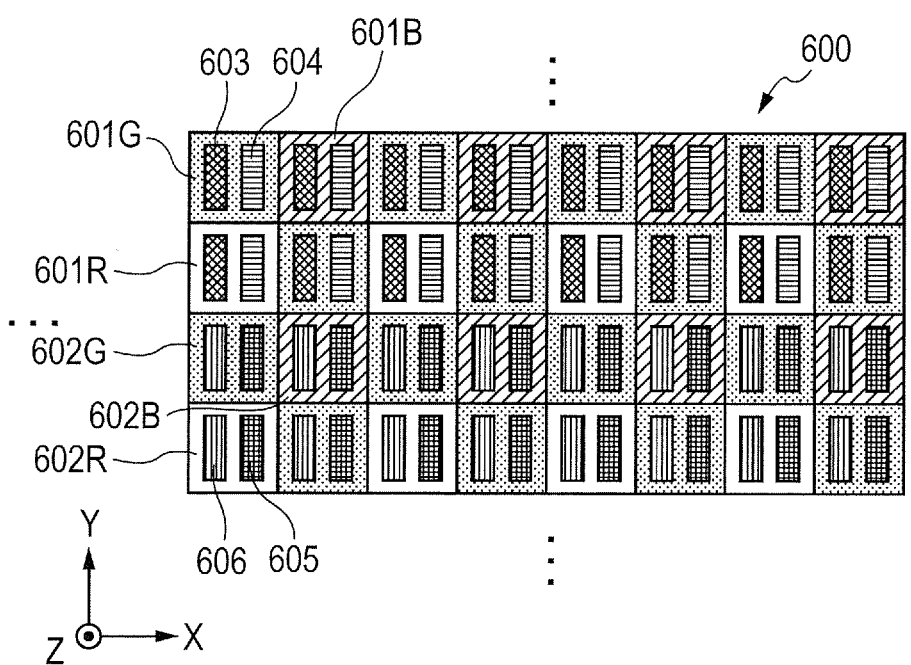

FIGS. 12A and 12B are views illustrating the configuration of the image sensor of the imaging apparatus of this example. Referring to FIG. 12A, image sensor 600 of the imaging apparatus of this example is formed by arranging pixels 601 and pixels 602. A pixel 601 has a pupil dividing means, a low sensitivity light receiving section 603 and a high sensitivity light receiving section 604, while a pixel 602 has a pupil dividing means, a low sensitivity light receiving section 605 and a high sensitivity light receiving section 606. They have a mutually-inverted positional relationship in the pupil dividing direction. Each of the pixels is structurally the same as one of the pixels described above in the preceding examples. With the above-described arrangement of this example, precision ranging to a high luminance object or a low luminance object can be achieved and a high quality image of the object can be produced as pointed out earlier.

When such pixels are used for all the pixels of the image sensor, a distance image and a picked-up image can be produced simultaneously.

As used herein, the expression of all the pixels of the image sensor means all the pixels that are substantially engaged in producing a picked up image (signals for picking an image of an object). In other words, pixels that are arranged in the image sensor as a sort of dummy pixels for some reason or another and not engaged in generating pickup signals are not included.

As all the pixels of the image sensor are provided with a feature of producing ranging signals, distance information (a distance map) on the object can be obtained for the position of each pixel. Then, the picked up image can be processed to intentionally provide it, for example, with blurring as post imaging processing on the basis of the obtained minute distance map. Additionally, as the light receiving sections (pixels) dedicated for acquiring image signals are eliminated, the image sensor can be prepared more easily because the image sensor then requires a reduced number of different types of light receiving sections. Note that pixels 601 and pixels 602 are desirably arranged on a same pixel row in a direction perpendicular to the pupil dividing direction (the y-direction in FIG. 12A). The difference between the ranging image acquired by pixels 601 and the ranging image acquired by pixels 602 can be minimized as they are arranged as close to each other as possible in the pupil dividing direction. Then, precision ranging can be achieved.

Pixels, each of which is provided with a color filter of red, green or blue, or pixels 601R, 601G, 601B, 602R, 602G and 602B may be used for the pixels 601 and the pixels 602 as illustrated in FIG. 12B. Then, for generating a picked up image, image signals that contain color information on a high luminance object or a low luminance object can be acquired at the low sensitivity light receiving sections and the high sensitivity light receiving sections of the pixels and hence a color image can be produced. For a ranging operation, a distance image can be acquired by measuring the distance to the object by means of the signals generated by the low sensitivity light receiving sections or the high sensitivity light receiving sections of the pixels that are provided with filters of a same color as in the preceding examples.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-075646, filed Mar. 29, 2012, which is hereby incorporated by reference herein in its entirety.

What is claimed is:

1. An imaging apparatus comprising:
an image sensor;
an imaging optical system for forming an image of an object on the image sensor; and
an image processing unit for processing signals from the image sensor,
wherein the image sensor comprises pixels for generating imaging signals, each of the pixels being either a first pixel or a second pixel, wherein a plurality of each of the first and second pixels is provided,
wherein the first pixel and the second pixel are arranged within an area in which luminous fluxes from the same objects are received,
wherein the first pixel includes a first pupil dividing unit, a first photoelectric conversion section, and a second photoelectric conversion section,
wherein the first photoelectric conversion section has higher sensitivity than the second photoelectric conversion section,
wherein the first pupil dividing unit comprises a microlens or optical waveguides, and is so configured as to be able to (a) guide light from a first area of a part of the exit pupil of the imaging optical system to the first photoelectric conversion section and (b) guide light from a second area of a part of the exit pupil of the imaging optical system to the second photoelectric conversion section,
wherein the second pixel includes a second pupil dividing unit, a third photoelectric conversion section, and a fourth photoelectric conversion section,
wherein the third photoelectric conversion section has higher sensitivity than the fourth photoelectric conversion section,
wherein the second pupil dividing unit comprises a microlens or optical waveguides, and is so configured as to be able to (a) guide light from a third area of a part of the exit pupil of the imaging optical system to the third photoelectric conversion section and (b) guide light from a fourth area of a part of the exit pupil of the imaging optical system to the fourth photoelectric conversion section,
wherein a positional relation between the higher sensitivity photoelectric conversion section and the lower sensitivity photoelectric conversion section in the pixel is inverted in a pupil-dividing direction between the first pixel and the second pixel, and
wherein in the image processing unit, amounts of discrepancies between a first ranging image formed by the light from the first area and a second ranging image formed by the light from the second area are obtained, and
wherein (i) in case where the luminous fluxes entering the first and second pixels are a smaller number, the first ranging image is formed using signals from a plurality of the first photoelectric conversion sections, and the second ranging image is formed using signals from a plurality of the third photoelectric conversion sections, and (ii) in case where the luminous fluxes entering the first and second pixels are a larger number, the first ranging image is formed using signals from a plurality of the second photoelectric conversion sections, and the second ranging image is formed using signals from a plurality of the fourth photoelectric conversion sections.

2. The imaging apparatus according to claim 1, wherein the first pupil dividing unit comprises the microlens arranged on the first pixel and the second pupil dividing unit comprises the microlens arranged on the second pixel.

3. The imaging apparatus according to claim 1, wherein luminous fluxes received by the second and fourth photoelectric conversion sections pass through a peripheral area or a narrow area of the exit pupil in comparison with luminous fluxes received by the first and third photoelectric conversion sections.

4. The imaging apparatus according to claim 3, wherein the first and third photoelectric conversion sections have light receiving surfaces greater than the second and fourth photoelectric conversion sections, or are arranged at positions closer to the center of the pixel in which each photoelectric conversion section is included.

5. The imaging apparatus according to claim 3, wherein a filter is arranged between the first and fourth photoelectric conversion sections and the first and second pupil dividing units, respectively,
wherein the filter comprises a light shielding member having an opening portion at the position of a light incidence side of each photoelectric conversion section, and
wherein the opening portion at the position of a light incidence side of the first and third photoelectric conversion sections has a greater opening width than the opening portion at the position of a light incidence side of the second and fourth photoelectric conversion sections, or is arranged at a position located closer to the respective center of the pixel in which each photoelectric conversion section is included.

6. The imaging apparatus according to claim 1, wherein the first and fourth areas are in the same area as each other, and the second and third areas are in the same area as each other, and
wherein a quantity of light received by the second and fourth photoelectric conversion sections is lower than that a quantity of light received by the first and third photoelectric conversion sections.

7. The imaging apparatus according to claim 1, wherein a filter is arranged between the first and fourth photoelectric conversion sections and the first and second pupil dividing units, respectively, and
wherein the filter comprises an absorbing medium at the position of a light incidence side of the second and fourth photoelectric conversion sections, and a non-absorbing medium at the position of a light incidence side of the first and third photoelectric conversion sections.

8. The imaging apparatus according to claim 1, wherein one or more than one first pixel and one or more than one second pixel are arranged along a direction perpendicular to the pupil-dividing direction in the image of the imaging element.

9. The imaging apparatus according to claim 1, wherein the first pixel and the second pixel are separated from each other by two pixels or less.

10. The imaging apparatus according to claim 1, wherein in each of the first and second pixels, the quantity of light received by the higher sensitivity photoelectric conversion section is greater than that received by the lower sensitivity photoelectric conversion section.

11. The imaging apparatus according to claim 1, wherein the quantity of light that is converted into electron changes in the higher sensitivity photoelectric conversion section is greater than that converted into electron changes in the lower sensitivity photoelectric conversion section.

12. The imaging apparatus according to claim 1, wherein the first photoelectric conversion section has a larger light receiving area than the second photoelectric conversion section, and wherein the third photoelectric conversion section has a larger light receiving area than the fourth photoelectric conversion section.

13. The imaging apparatus according to claim 12, wherein the first area of the exit pupil includes the fourth area of the exit pupil, and wherein the third area of the exit pupil includes the second area of the exit pupil.

14. The imaging apparatus according to claim 13, wherein the first pupil dividing unit comprises a first microlens for guiding light from the first area of the exit pupil to the first photoelectric conversion section and for guiding light from the second area of the exit pupil to the second photoelectric conversion section, and
wherein the second pupil dividing unit comprises a second microlens for guiding light from the third area of the exit pupil to the third photoelectric conversion section and for guiding light from the fourth area of the exit pupil to the fourth photoelectric conversion section.

15. The imaging apparatus according to claim 14, wherein the first pixel is provided with a first color filter of red, green, or blue,
wherein the second pixel is provided with a second color filter of red, green, or blue,
wherein the first photoelectric conversion section receives the light from the first area of the exit pupil after passing through the first color filter,
wherein the second photoelectric conversion section receives the light from the second area of the exit pupil after passing through the first color filter,
wherein the third photoelectric conversion section receives the light from the third area of the exit pupil after passing through the second color filter, and
wherein the fourth photoelectric conversion section receives the light from the fourth area of the exit pupil after passing through the second color filter.

16. The imaging apparatus according to claim 15, wherein the image processing unit, by processing signals of the image sensor, produces a distance map with distance information of the object and a picked up image of the object.

17. The imaging apparatus according to claim 16, wherein the distance information is (a) the amounts of the discrepancies, (b) amounts of defocuses obtained based on the amounts of discrepancies, or (c) a distance to an object obtained based on the amounts of discrepancies.

18. An imaging apparatus comprising:
an image sensor; and
an imaging optical system for forming an image of an object on the image sensor; and
an image processing unit for processing signals from the image sensor,
wherein the image sensor comprises first pixels and second pixels,
wherein the first pixels and the second pixels are arranged in an area receiving luminous flux of the same objects,
wherein a first pupil dividing unit, a first photoelectric conversion section, and a second photoelectric conversion section are mounted in the first pixel, wherein the first photoelectric conversion section has higher sensitivity than the second photoelectric conversion section, wherein the first pupil dividing unit comprises a first optical waveguide and a second optical waveguide, and is so configured as to be able to (a) guide light from a first area of a part of the exit pupil of the imaging optical system to the first photoelectric conversion section and (b) guide light from a second area of a part of the exit pupil of the imaging optical system to the second photoelectric conversion section, wherein a second pupil dividing unit, a third photoelectric conversion section, and a fourth photoelectric conversion section are mounted in the second pixel, wherein the third photoelectric conversion section has higher sensitivity than the fourth photoelectric conversion section, wherein the second pupil dividing unit comprises a third optical waveguide and a fourth optical waveguide, and is so configured as to be able to (a) guide light from a third area of a part of the exit pupil of the imaging optical system to the third photoelectric conversion section and (b) guide light from a fourth area of a part of the exit pupil of the imaging optical system to the fourth photoelectric conversion section, wherein a positional relation between the higher sensitivity photoelectric conversion section and the lower sensitivity photoelectric conversion section in the pixel is inverted in a pupil-dividing direction between the first pixel and the second pixel, wherein the first optical waveguide and the second optical waveguide correspond to the respective photoelectric sections on the optical incidence sides of the first photoelectric conversion section and the second photoelectric conversion section, wherein the third optical waveguide and the fourth optical waveguide correspond to the respective photoelectric sections on the optical incidence sides of the third photoelectric conversion section and the fourth photoelectric conversion section, and wherein in the image processing unit, amounts of discrepancies between a first ranging image formed by the light from the first area and a second ranging image formed by the light from the second area are obtained, and wherein (i) in case where the luminous fluxes entering the first and second pixels are a smaller number, the first ranging image is formed using signals from a plurality of the first photoelectric conversion sections, and the second ranging image is formed using signals from a plurality of the third photoelectric conversion sections, and (ii) in case where the luminous fluxes entering the first and second pixels are a larger number, the first ranging image is formed using signals from a plurality of the second photoelectric conversion sections, and the second ranging image is formed using signals from a plurality of the fourth photoelectric conversion sections.

19. The imaging apparatus according to claim 18, wherein the first optical waveguide and the third optical waveguide have a larger core diameter than the core diameter of the second optical waveguide and the fourth optical waveguide, or have core sections arranged at positions located closer to the centers of the first and second pixels.

\* \* \* \* \*